United States Patent
Wang et al.

(10) Patent No.: US 9,165,635 B2
(45) Date of Patent: Oct. 20, 2015

(54) MEMORY CONTROLLING DEVICE AND METHOD THEREOF FOR CONTROLLING MEMORY WITH PARTIAL ARRAY SELF REFRESH (PASR) FUNCTION

(71) Applicant: INDUSTRIAL TECHNOLOGY RESESARCH INSTITUTE, Hsinchu (TW)

(72) Inventors: Mao-Yin Wang, New Taipei (TW); Juin-Ming Lu, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 168 days.

(21) Appl. No.: 13/889,773

(22) Filed: May 8, 2013

(65) Prior Publication Data
US 2014/0189230 A1    Jul. 3, 2014

(30) Foreign Application Priority Data
Dec. 27, 2012   (TW) .............................. 101150622 A

(51) Int. Cl.
G11C 11/406     (2006.01)
G06F 12/02      (2006.01)

(52) U.S. Cl.
CPC ...... *G11C 11/40615* (2013.01); *G06F 12/0223* (2013.01); *G11C 11/40622* (2013.01); *G11C 2211/4067* (2013.01)

(58) Field of Classification Search
CPC ........... G11C 11/406; G11C 11/40611; G11C 11/40615; G11C 11/40622; G11C 2211/4067; G06F 13/1636; G06F 12/0223
USPC .......................................... 711/106; 365/222
See application file for complete search history.

(56) References Cited

U.S. PATENT DOCUMENTS 6,650,587 B2    11/2003  Derner et al.
6,738,861 B2    5/2004   Lawrence
(Continued)

FOREIGN PATENT DOCUMENTS

EP    2343657 A1    7/2011
TW     564420 B    12/2003
(Continued)

OTHER PUBLICATIONS

Intellectual Property Office, Ministry of Economic Affairs, R.O.C., "Office Action", Taiwan, Dec. 8, 2014.
(Continued)

*Primary Examiner* — Jasmine Song
(74) *Attorney, Agent, or Firm* — Locke Lord LLP; Tim Tingkang Xia, Esq.

(57) ABSTRACT

A memory controlling device and method are disclosed for controlling a memory having a partial array self refresh (PASR) function and a plurality of memory segments. The memory controlling device comprises an address mapper, an address decoder, an address selector, and a PASR configuration register storing a PASR configuration. The address mapper converts an input address set into a mapped address set according to an address offset. The mapped address set comprises a plurality of consecutive mapped addresses or at least one mapped address within a limited range. The address decoder updates the PASR configuration during writing. The address selector generates an updated address set, which is used for setting at least one mode register of the memory, according to the PASR configuration register under a sleep-or-standby mode in order that the memory can self refresh at least one of the memory segments correspondingly.

38 Claims, 32 Drawing Sheets

(56) References Cited

U.S. PATENT DOCUMENTS

| | | |
|---|---|---|
| 6,834,022 B2 | 12/2004 | Derner et al. |
| 7,088,635 B2 | 8/2006 | Hur et al. |
| 7,149,140 B2 | 12/2006 | Hur et al. |
| 7,380,048 B2 | 5/2008 | Lawrence |
| 7,492,656 B2 * | 2/2009 | Kim et al. .................. 365/222 |
| 7,757,039 B2 | 7/2010 | Kaburlasos et al. |
| 7,916,569 B2 | 3/2011 | Kim et al. |
| 2009/0172270 A1 | 7/2009 | Kardach et al. |
| 2010/0027421 A1 | 2/2010 | Goossens et al. |
| 2010/0274960 A1 | 10/2010 | Lee et al. |
| 2011/0131432 A1 | 6/2011 | Berke et al. |
| 2011/0173477 A1 | 7/2011 | Asaba |
| 2011/0219248 A1 | 9/2011 | Cho et al. |
| 2011/0296095 A1 | 12/2011 | Su et al. |
| 2011/0296098 A1 | 12/2011 | Sauber et al. |
| 2012/0089772 A1 | 4/2012 | Kardach et al. |

FOREIGN PATENT DOCUMENTS

| | | |
|---|---|---|
| TW | I252398 B | 4/2006 |
| TW | I267080 B | 11/2006 |
| TW | 200807418 A | 2/2008 |
| TW | I319577 B | 1/2010 |
| TW | 201039346 A | 11/2010 |
| TW | 201142588 A | 12/2011 |

OTHER PUBLICATIONS

Katayama et al., Fault-Tolerant Refresh Power Reduction of DRAMs for Quasi-Nonvolatile Data Retention, 1999, pp. 311-318, Defect and Fault Tolerance in VLSI Systems, 1999. DFT '99. International Symposium.

Ahn et al., Adaptive Self Refresh Scheme for Battery Operated High-Density Mobile DRAM Applications, 2006, pp. 319-322, Solid-State Circuits Conference, 2006. ASSCC 2006. IEEE Asian.

Brandt et al., Analysis of the PASR Standard and its usability in Handheld Operating Systems such as Linux, CiteSeerX.

Pyo et al., 45nm Low-Power Embedded Pseudo-SRAM with ECC-Based Auto-Adjusted Self-Refresh Scheme, 2009, pp. 2517-2520, Circuits and Systems, 2009. ISCAS 2009. IEEE International Symposium.

Kjellberg, Partial Array Self-refresh in Linux, 2010, Lund University, Sweden.

Cha, et al., Check-bit-reduced codewords using non-2n data bits for ECC-based self-refresh enhancement techniques in DRAMs, 2010, pp. 1-2, Electronics Letters vol. 46 No. 22.

Liu, et al., Flikker: Saving DRAM Refresh-power through Critical Data Partitioning, 2011, pp. 213-224, ASPLOS'11, Mar. 5-11.

Bae, et al., A 1.2V 30nm 1.6Gb/s/pin 4Gb LPDDR3 SDRAM with Input Skew Calibration and Enhanced Control Scheme, 2012, pp. 44-45, 2012 IEEE International Solid-State Circuits Conference.

Clarke, Smartphones to drive DRAM, says IHS, 2011, EETimes News & Analysis, Jan. 14-18 Wireless for Miniaturized Consumer Electronics & Mobile Products Sponsored by: Rohde&Schwarz.

Low Power Double Data Rate 3 (LPDDR3), JEDEC Standard, 2012, JESD209-3, © JEDEC Solid State Technology Association 2012.

Wide I/O Single Data Rate (Wide I/O SDR), JEDEC Standard, 2011, JESD229, © JEDEC Solid State Technology Association 2011.

Low Power Double Data Rate 2 (LPDDR2), JEDEC Standard, 2011, JESD209-2E (Revision of JESD209-2D, Dec. 2010), © JEDEC Solid State Technology Association 2011.

* cited by examiner

MEMORY CONTROLLING DEVICE AND METHOD THEREOF FOR CONTROLLING MEMORY WITH PARTIAL ARRAY SELF REFRESH (PASR) FUNCTION

CROSS-REFERENCE TO RELATED APPLICATIONS

This non-provisional application claims priority under 35 U.S.C. §119(a) on Patent Application No(s). 101150622 filed in Taiwan, R.O.C. on Dec. 27, 2012, the entire contents of which are hereby incorporated by reference.

TECHNICAL FIELD

The disclosure relates to a memory controlling device, and more particularly to a memory controlling device and a method thereof for controlling a memory with a partial array self refresh (PASR) function.

BACKGROUND

Newly added functions of portable devices require the corresponding enhancement of efficiency and battery life. Therefore, the design of the portable devices faces the problems of how to reduce the power consumption for extending battery life and standby time. On the other hand, the development of the smart phone market leads the continuous growth of memory shipments. In the future, larger memory capacity is required for portable devices. Therefore, the issue of how to reduce the power consumption of memory is being emphasized.

For the power consumption of memory in portable devices, it is necessary to develop technologies for effectively reducing the power consumption of memory by the partial array self refresh (PASR) function.

SUMMARY

According to an embodiment in the disclosure, a memory controlling device adapted to be disposed in a computer is provided, and is used for controlling a memory which has a partial array self refresh (PASR) function and includes a plurality of memory segments in the computer. The computer operates under a normal mode and a sleep-or-standby mode. The memory controlling device includes a PASR configuration register, an address mapper, an address decoder and an address selector.

The PASR configuration register is used for storing a PASR configuration. The PASR configuration includes a plurality of PASR configuration bits, and the PASR configuration bits correspond to the memory segments respectively. The address mapper is used for receiving an input address set, for converting the input address set into a mapped address set, and for outputting the mapped address set. The mapped address set includes at least one mapped address in a limited range, or includes a plurality of successive mapped addresses.

The address decoder is coupled to the PASR configuration register and the address mapper. Under the normal mode, the address decoder is used for receiving the mapped address set and the PASR configuration, for updating the PASR configuration according to the mapped address set, and for storing the updated PASR configuration in the PASR configuration register. The address selector is coupled to the memory, the PASR configuration register and the address mapper. Under the normal mode, the address selector is used for receiving the mapped address set to generate an updated address set used for accessing the memory. Under the sleep-or-standby mode, the address selector is used for receiving the updated PASR configuration to generate the updated address set according to the updated PASR configuration. The address selector sets at least one mode register of the memory according to the updated address set, so that the memory self refreshes at least one of the memory segments corresponding to the PASR configuration.

Furthermore, according to an embodiment in the disclosure, a memory controlling method is provided for controlling a memory with a PASR function in a computer. The computer operates under a normal mode and a sleep-or-standby mode. The memory includes a plurality of memory segments. The memory controlling method includes following steps. An input address set is received. The input address set is converted into a mapped address set, the mapped address set includes at least one mapped addresses in a limited range, or includes a plurality of consecutive mapped addresses.

Under the normal mode, the memory controlling method performs the following steps. A PASR configuration is updated according to the mapped address set, the PASR configuration includes a plurality of PASR configuration bits, and the PASR configuration bits are corresponded to the memory segments respectively. The updated PASR configuration is stored. An updated address set for accessing the memory is generated according to the mapped address set.

Under the sleep-or-standby mode, the memory controlling method performs the following steps. The updated address set is generated according to the updated PASR configuration. At least one mode register of the memory is set according to the updated address set. The memory is controlled to self refresh at least one of the memory segments, corresponding to the PASR configuration, according to the mode register.

According to an embodiment in the disclosure, a memory controlling device disposed in a computer is provided for controlling a memory with a PASR function in the computer. The memory includes a plurality of memory segments, and the memory controlling device includes a backup memory unit, a sleep flag, a PASR configuration register, a controller, an address decoder and an address selector.

The sleep flag records whether the computer including the memory is under a normal mode or a sleep-or-standby mode. The PASR configuration register stores a PASR configuration. The PASR configuration includes a plurality of PASR configuration bits. The PASR configuration bits correspond to the memory segments respectively. The controller is coupled to the memory, the sleep flag and the backup memory unit. Under the sleep-or-standby mode, the controller generates a controller output address set used for accessing the memory, and copies content of at least one of the memory segments, which corresponds to the controller output address set, to the backup memory unit. The address decoder is coupled to the sleep flag, the controller and the PASR configuration register. Under the sleep-or-standby mode, the address decoder updates at least one of the PASR configuration bits of the PASR configuration corresponding to the controller output address set, and stores the updated PASR configuration in the PASR configuration register. The address selector is coupled to the memory, the PASR configuration register and the controller. The address selector receives the controller output address set or the updated PASR configuration under the sleep-or-standby mode to generate an updated address set, so as to control the memory to self refresh the at least one memory segment corresponding to the PASR configuration, according to the updated address set.

BRIEF DESCRIPTION OF THE DRAWINGS

The disclosure will become more fully understood from the detailed description given herein below for illustration only and thus does not limit the disclosure, wherein.

DETAILED DESCRIPTION

Figure 1:
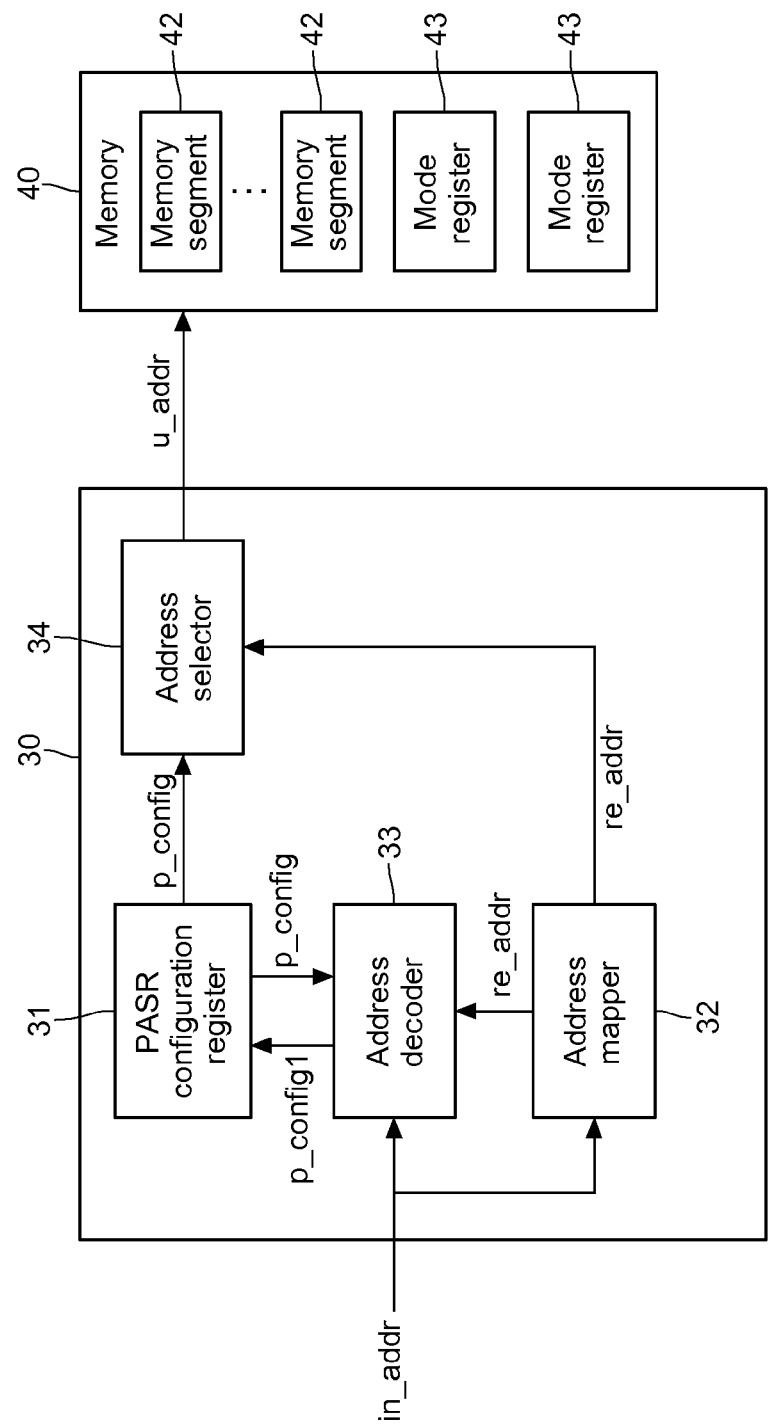
FIG. 1 is a block diagram of a memory controlling device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A memory controlling device provided by the disclosure is used for controlling a memory having a partial array self refresh (PASR) function and a plurality of memory segments.

FIG. 1 is a block diagram of a memory controlling device according to an embodiment of the disclosure. According to an embodiment, a memory controlling device 30 includes a PASR configuration register 31, an address mapper 32, an address decoder 33 and an address selector 34.

A memory 40 is, for example, a dynamic random access memory (DRAM), a synchronous dynamic random access memory (SDRAM) or a mixture of a DRAM and a static random access memory (SRAM), having the PASR function. The memory controlling device 30 and the memory 40 can be disposed in a computer. The computer can be a portable or a non-portable computer. The computer can operate under a normal mode and a sleep-or-standby mode. The PASR configuration register 31 is used for storing a PASR configuration p_config. The PASR configuration p_config includes a plurality of PASR configuration bits, and the PASR configuration bits correspond to memory segments 42 of the memory 40 respectively. Specifically, the memory segments 42 are, for example, the smallest access units of the memory 40. The PASR configuration bits correspond to the smallest access units of the memory 40 respectively.

Values of the PASR configuration bits are, for example, 0 or 1. Generally speaking, when the value of the PASR configuration bit is 0, it represents that the corresponding memory segment 42 is required to be self-refreshed when the computer including the memory 40 and the memory controlling device 30 is under the sleep-or-standby mode. When the value of the PASR configuration bit is 1, it represents that the corresponding memory segment 42 is not required to be self-refreshed when the computer is under the sleep-or-standby mode. Furthermore, the PASR configuration register 31 can be embodied by a finite state machine (FSM).

The address mapper 32 is coupled to the address decoder 33 and the address selector 34. The address mapper 32 under the normal mode receives an input address set in_addr. The input address set in_addr includes at least one input address which indicates which memory segment 42 the data is written to. The address mapper 32 converts the input address set in_addr into a mapped address set re_addr and outputs the mapped address set re_addr. The mapped address set re_addr includes at least one mapped address in a limited range, or includes a plurality of successive mapped addresses.

According to an embodiment, the address mapper 32 can be embodied by an arithmetic logic circuit. The address mapper 32 under the normal mode receives the input address set in_addr and an address offset addr_offset. The address mapper 32 converts the input address set in_addr into the mapped address set re_addr according to the address offset addr_offset. In this embodiment, an initial value of each of all the PASR configuration bits is, for example, 1, which represents that no data has been stored in all the memory segments 42 when the memory 40 starts to operate, and whereby the memory segments 42 are not required to be self-refreshed.

The address decoder 33 is coupled to the PASR configuration register 31 and the address mapper 32. The address decoder 33 is used for receiving the mapped address set re_addr and the PASR configuration p_config during the data writing, and outputting a PASR configuration update signal p_config1 according to the mapped address set re_addr to update the PASR configuration p_config currently stored in the PASR configuration register 31. After the address mapper 32 has generated the mapped address set re_addr, the address decoder 33 can also output the PASR configuration update signal p_config1 according to a condition of the input address set in_addr being mapped to update the PASR configuration p_config currently stored in the PASR configuration register 31, in order to control that the corresponding memory segments 42 are required to be self-refreshed when the computer is under the sleep-or-standby mode.

The address selector 34 is coupled to the memory 40, the address mapper 32 and the PASR configuration register 31. The address selector 34 under the normal mode receives the mapped address set re_addr to generate an updated address set u_addr used for accessing the memory 40. The address selector 34 under the sleep-or-standby mode receives the updated PASR configuration p_config to generate the updated address set u_addr. The address selector 34 sets at least one mode register 43 of the memory 40 to control the memory 40 to self refresh at least one of the memory segments 42 correspondingly.

Briefly, the address mapper 32 can be used for generating the address used for accessing the memory 40. By generating the at least one mapped address set re_addr in the limited range or generating the successive mapped address set re_addr, the data can be written to the consecutive memory segments 42 or the non-consecutive memory segments 42. Therefore, the data will be gathered in one of the specific memory segments 42 or more than one of the specific memory segments 42 in the memory 40, and the remaining memory segments 42 without any written data are not required to be self-refreshed under the sleep-or-standby mode. Herein, power for the remaining memory segments 42 will be cut off in order to reduce the power consumption of the memory 40 under the system sleep-or-standby mode.

Figure 2:
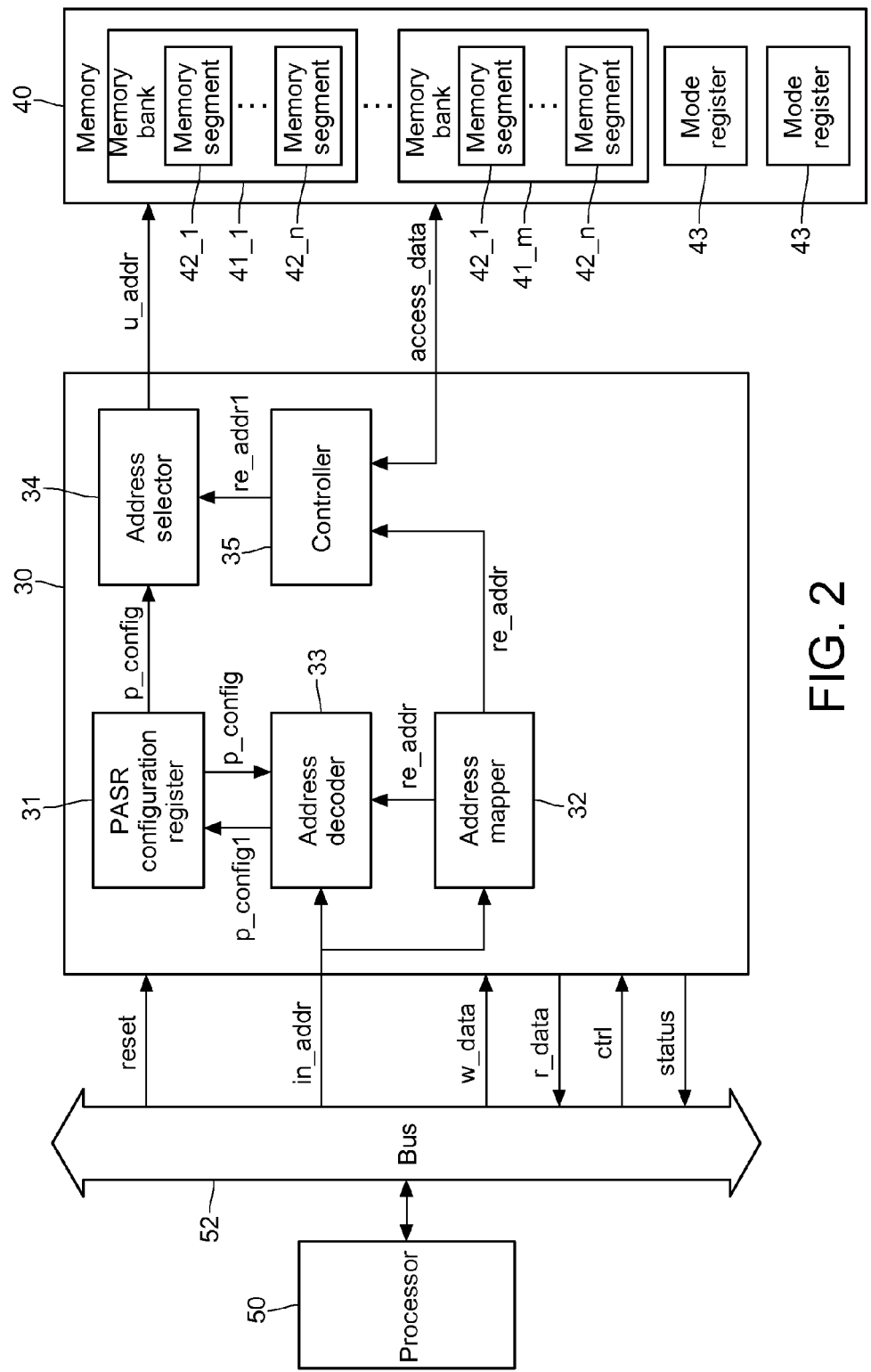
FIG. 2 is a block diagram of the memory controlling device according to an embodiment of the disclosure.

According to an embodiment, the memory controlling device 30 can further comprise a controller 35 as shown in FIG. 2. The controller 35 is coupled to the memory 40, the address mapper 32 and the address selector 34. The memory 40 includes m memory banks 41_1 to 41_m (hereinafter the memory banks 41). One memory banks 41 includes n memory segments 42_1 to 42_n, and both m and n are positive integers greater than 1.

The controller 35 receives the mapped address set re_addr from the address mapper 32 and outputs a transmitted mapped address set re_addr1 for transmitting the received mapped address set re_addr to the address selector 34. The address selector 34 under the normal mode receives the transmitted mapped address set re_addr1 to generate the updated address set u_addr used for accessing the memory 40. The address selector 34 receives the updated PASR configuration p_config to generate the updated address set u_addr under the sleep-or-standby mode, in order to set the mode registers 43 of the memory 40 to control the memory 40 to self refresh at least one of the memory segments 42 correspondingly.

The controller 35 can perform data reading and writing when the computer is under the normal mode. In other words, a state that the memory 40 performs ordinary data writing or data reading belongs to the normal mode. The controller 35 includes an address queue, a command queue, a data writing queue, a data reading queue, a memory finite state machine controlling unit, an address generator, a command generator, a data writing first in first out (FIFO) buffer and a data reading FIFO buffer.

The memory controlling device 30 can be coupled to a processor 50 through an external bus 52. The memory controlling device 30 receives the input address set in_addr and a reading and writing signal WR from the processor 50. The memory 40 can be set under one of a writing mode and a reading mode under the normal mode according to the reading and writing signal WR. The normal mode and the sleep-or-standby mode belong to the working modes of the computer, and the writing mode and the reading mode belong to the working modes of the memory 40.

The memory controlling device 30 receives a signal of written data w_data, a control signal ctrl and a resetting signal from the processor 50 through the external bus 52. The memory controlling device 30 transmits a signal of read data r_data and a status signal status to the processor 50 through the external bus 52. The processor 50 is, for example, a central processing unit (CPU).

Figure 3A:
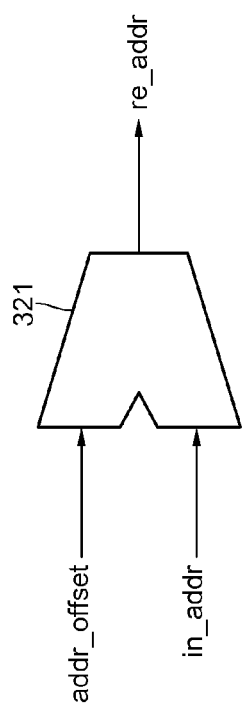
FIG. 3A is a schematic diagram of an address mapper according to an embodiment of the disclosure.

FIG. 3A is a schematic diagram of the address mapper according to an embodiment of the disclosure. In this embodiment, the address mapper 32 includes a first operation unit 321. The first operation unit 321 is used for adding the input address set in_addr and the address offset addr_offset to generate the mapped address set re_addr, and for outputting the mapped address set re_addr to the controller 35. In this way, the input address set in_addr can be converted into the mapped address set re_addr by using a shift operation or a rotation operation.

The first operation unit 321 can be embodied by a combinational circuit. Specifically, the first operation unit 321 can be an adder. If an adder is implemented as the first operation unit 321, the bit width of the output signal re_addr of the adder is the same as that of the input address set in_addr and that of the address offset addr_offset regardless of carry or overflow. The input address set in_addr can be a control address set used by the processor 50 for accessing the memory 40, or can be merely a part of the control address set.

For example, the bit width of each control address in the control address set can be 16-bit, and just the last 10 bits or 6 bits of the 16 bits, used for specifying the memory segments 42, are enough for performing operation. The first operation unit 321 can take a part of the bits from the generated mapped address set re_addr to the controller 35. Assume that there are a total of the sixty-four memory segments 42 in the memory 40; then only a 6-bit address is enough for specifying any one of the memory segments 42. Therefore, the address mapper 32 can only output the 6-bit mapped address set re_addr.

The first operation unit 321 can use a part of the signals of the input address set in_addr as the rest of the control address for the controller 35. Assume that the bit width of the control address is 16-bit; the 6-bit mapped address set re_addr can be obtained according to the method mentioned above. The first operation unit 321 can take 10 bits, each not corresponding to any bit of the mapped address set re_addr, from the input address set in_addr, and the taken 10 bits and the mapped address set re_addr are combined to form the control address connected to the controller 35.

The address offset addr_offset can be set according to the system configuration of the memory 40, or can be set when the operating system of the computer, e.g. Android operating system, boots and executes application programs, e.g. An3DBenchXL application program. For example, as shown in the top part in FIG. 4A, when the Android operating system boots, the data in memory banks B0, B5, B6 and B7 of the memory 40 are accessed. The memory banks B0, B5, B6 and B7 can correspond to the memory banks 41_1, 41_6, 41_7 and 41_8 in FIG. 2, where the memory banks 41_6 to 41_8 are not shown in the drawing but can be learnt from the three memory banks 41 between the memory banks 41_1 and 41_m.

Figures 4A, 4B:
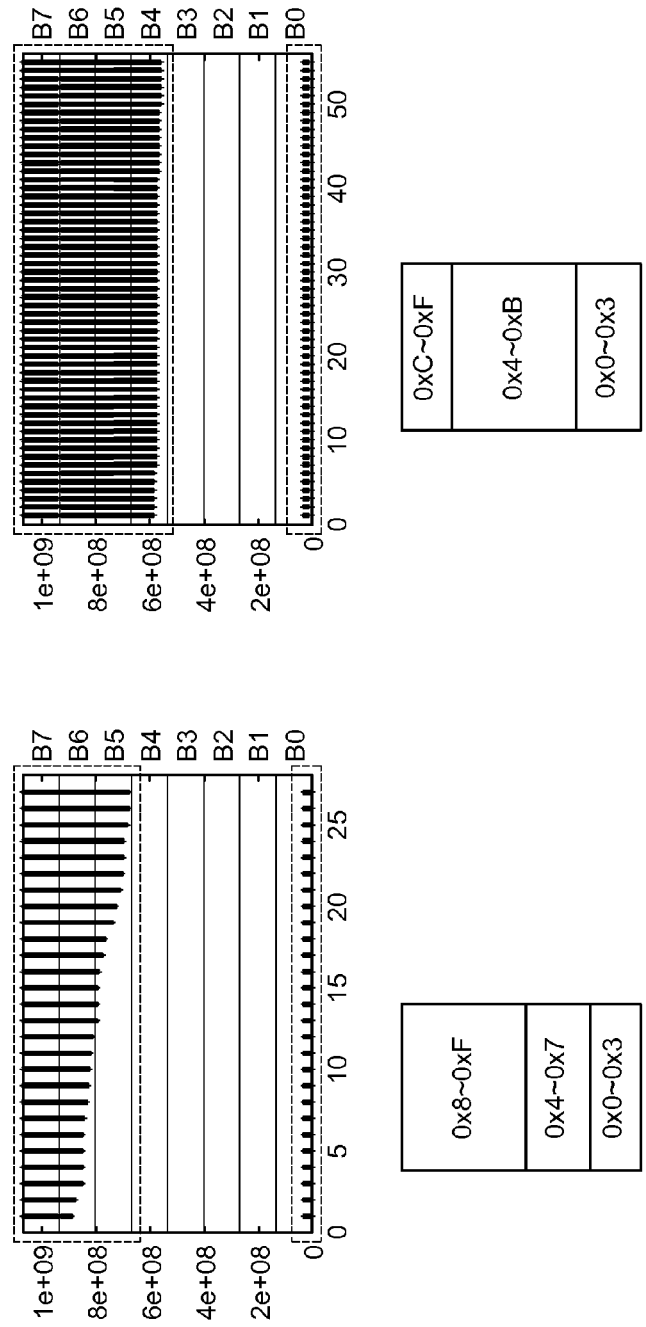
FIG. 4A is a schematic diagram illustrating an accessing state of memory address and an input address set according to an embodiment of the disclosure.
FIG. 4B is a schematic diagram illustrating an accessing state of memory address and a mapped address set according to an embodiment of the disclosure.

As shown in the top part in FIG. 4B, after the booting and An3DBenchXL application program are executed, the memory banks B0, B4, B5, B6 and B7 of the memory 40 are accessed. The memory banks B0, B4, B5, B6 and B7 can correspond to the memory banks 41_1, 41_5, 41_6, 41_7 and 41_8 in FIG. 2, where the memory banks 41_5 to 41_8 are not shown in the drawing but can be learnt from the four memory banks 41 between the memory banks 41_1 and 41_m. It can be understood from FIGS. 4A and 4B that an address offset operation can be performed on the addresses used for accessing the memory 40, so that the data in the memory 40 can be gathered in the consecutive memory banks 41 or the memory segments 42. When the computer is under the sleep-or-standby mode, the memory 40 can self refresh less quantity of the memory segments 42.

For example, as shown in the bottom part in FIG. 4A, if data is stored in the memory spaces indicated by addresses 0x0 to 0x3 and 0x8 to 0xF of the memory 40, and if no data is stored in the memory space indicated by addresses 0x4 to 0x7 of the memory 40, the address offset addr_offset for the address offset operation can be set as 0xC (0xF−0x3=0xC). Then, each of the mapped addresses of the mapped address set re_addr equals to 0xC plus each of the input addresses of the input address set in_addr. In this way, the memory spaces indicated by the addresses 0xC to 0xF and 0x4 to 0xB of the memory 40 will be used for storing data, and the memory space indicated by the addresses 0x0 to 0x3 of the memory 40 will be available (as shown in the bottom part of FIG. 4B). Therefore, the memory space indicated by the addresses 0x0 to 0x3 of the memory 40 will be not needed to be self-refreshed when the computer is under the sleep-or-standby mode.

Even though it is possible that more logic gates are required for the implementation of the first operation unit 321, the first operation unit 321 can generate the mapped address set re_addr directly by its arithmetic logic. Therefore, the mapped address set re_addr can be obtained speedily.

Figure 3B:
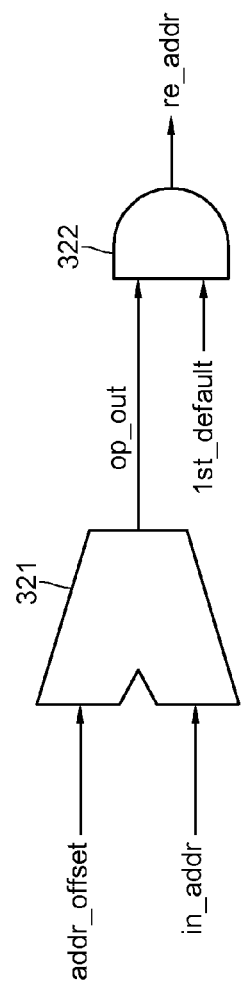
FIG. 3B is a schematic diagram of the address mapper according to an embodiment of the disclosure.

FIG. 3B is a schematic diagram of the address mapper according to an embodiment of the disclosure. In this embodiment, the address mapper 32 includes the first operation unit 321 and a first AND gate 322. The first AND gate 322 is used for performing AND operation on an output signal op_out of the first operation unit 321 and a first default signal 1st_default, and the AND result is set as the mapped address set re_addr and is outputted to the controller 35. The first default signal 1st_default is used for setting the bit number of the mapped address set re_addr. For example, if the 4-bit mapped address set re_addr is required, the first default signal 1st_default can be set as 0xF. For another example, if the 8-bit mapped address set re_addr is required, the first default signal 1st_default can be set as 0xFF.

As mentioned above, the memory controlling device 30 can learn whether the memory 40 is required to be written with data, according to the reading and writing signal WR. In the following description, assume that the memory 40 is under the writing mode if the value of the reading and writing signal WR is 1, and the memory 40 is under the reading mode if the value of the reading and writing signal WR is 0. In the writing mode, the address mapper 32 generates the consecutive mapped address set re_addr or generates the mapped address set re_addr in a limited range according to the input address set in_addr and the address offset addr_offset. The controller 35 stores the written data w_data in at least one of the memory segments 42 corresponding to the mapped address set re_addr, so that the written data w_data can be gathered and stored in the specific memory segments 42. In the reading mode, the address mapper 32 generates the mapped address set re_addr corresponding to the input address set in_addr, and the controller 35 reads the required read data r_data from at least one of the memory segments 42 corresponding to the mapped address set re_addr.

Figure 5A:
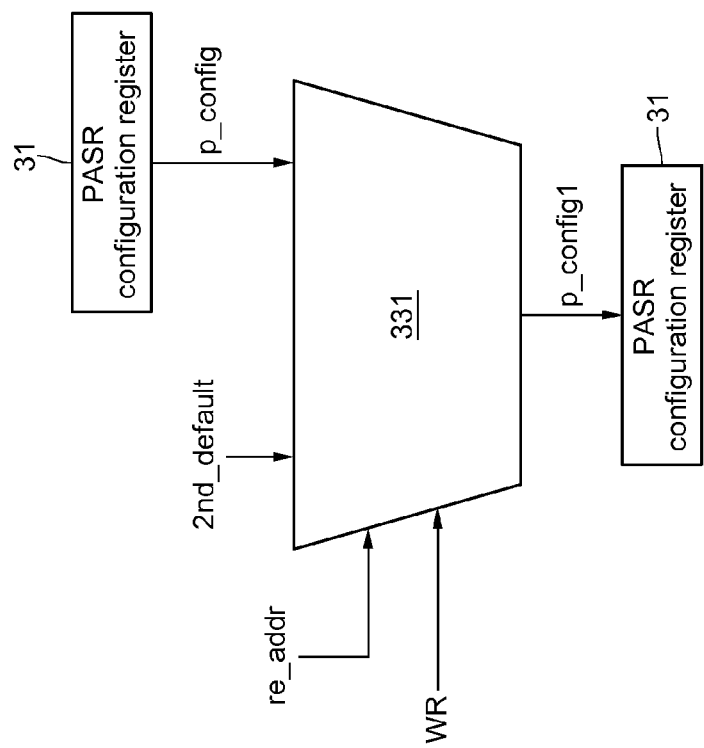
FIG. 5A is a schematic diagram of an address decoder according to an embodiment of the disclosure.

Refer to FIG. 3B and FIG. 5A, data is being written in the memory 40 under the writing mode, and data is being read out from the memory 40 under the reading mode. The address decoder 33 includes a first multiplexer 331. In the writing mode, the address decoder 33 outputs the PASR configuration update signal p_config1 according to the mapped address set re_addr, so as to update the PASR configuration p_config currently stored in the PASR configuration register 31. Furthermore, the first multiplexer 331 updates the PASR configuration p_config according to the mapped address set re_addr, the PASR configuration p_config and the reading and writing signal WR. The reading and writing signal WR is used for indicating whether the memory 40 is under the writing mode or the reading mode of the normal mode currently.

Each of the updated PASR configuration bits can be a second default signal 2nd_default, or be the corresponding PASR configuration bit before updating. If a value of the PASR configuration bit is 0, it represents that the corresponding memory segment 42 is needed be self-refreshed when the computer is under the sleep-or-standby mode, and the second default signal 2nd_default can be set to 0. In the writing mode, the controller 35 writes the written data w_data to the memory segment 42 of the memory 40 corresponding to the mapped address set re_addr, so all the PASR configuration bits corresponding to the mapped address set re_addr are required to be changed to 0. Therefore, under the writing mode, the values of the updated PASR configuration bits corresponding to the mapped address set re_addr are set to 0, and the values of the updated PASR configuration bits not corresponding to the mapped address set re_addr are still the corresponding values of the PASR configuration bits before updating.

For example, assume that the input address set in_addr has an input address 0x00, a mapped address 0x0C is obtained after the input address 0x00 is mapped. In the writing mode, the values of the PASR configuration bits corresponding to the memory segments 42 specified by the mapped address 0x0C are updated as 0. Under the reading mode, no content stored in the memory segments 42 will be modified, so the PASR configuration p_config is not needed to be updated when the reading and writing signal WR is 0.

Figure 3C:
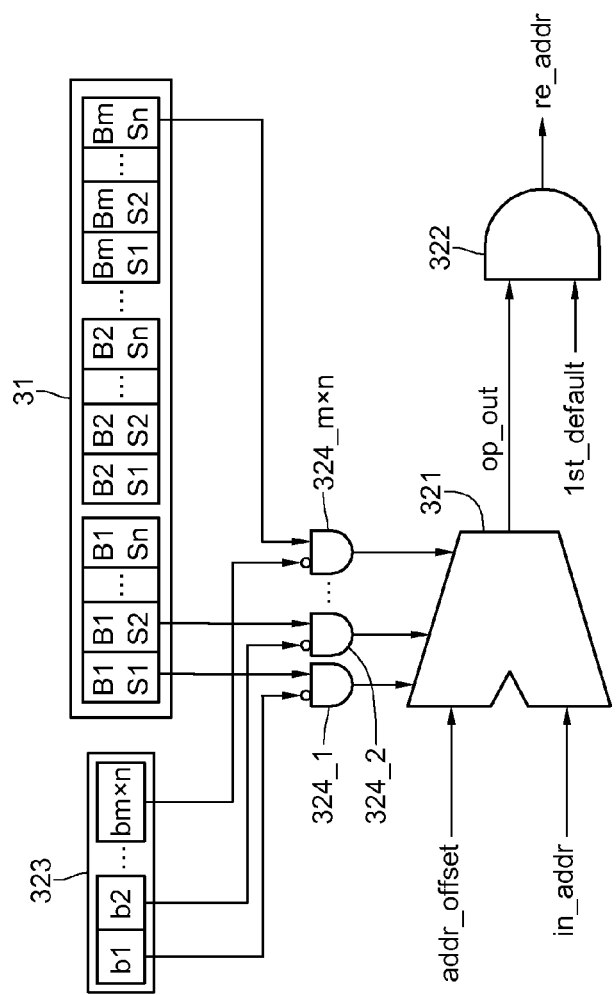
FIG. 3C is a schematic diagram of the address mapper according to an embodiment of the disclosure.
Figure 5B:
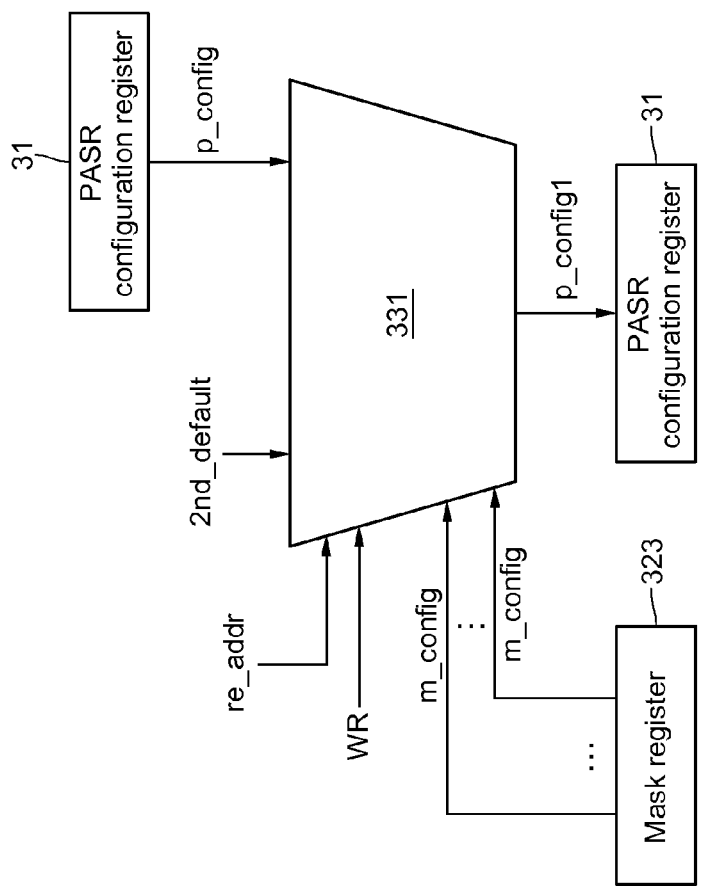
FIG. 5B is a schematic diagram of an address decoder according to an embodiment of the disclosure.

Refer to FIG. 3C and FIG. 5B, the address mapper 32 includes the first operation unit 321, the first AND gate 322 and a mask register 323 and m×n second AND gates 324_1 to 324__m×n.

The mask register 323 is used for storing a mask configuration m_config. The mask configuration m_config includes a plurality of mask configuration bits, e.g. the mask configuration bits b__1 to b_m×n in FIG. 3C. The mask configuration bits correspond to the PASR configuration bits respectively and are used for indicating whether the corresponding PASR configuration bits or the corresponding memory segments 42 can be mapped. In the description below, the mask configuration bit with a value 0 represents that the corresponding PASR configuration bit or the corresponding memory segment 42 can be mapped, and the mask configuration bit with a value 1 represents that the corresponding PASR configuration bit or the corresponding memory segment 42 can not be mapped.

Because there may be special data, e.g. booting procedures or restoring procedures of the operating system, which should not be modified and is stored in specific locations in the memory 40, the mask configurations m_config can be set for the corresponding memory segments 42 storing the special data. According to an embodiment, the memory 40 includes m memory banks 41, each of the m memory banks 41 includes n memory segments 42, and m and n are positive integers. The PASR configuration bits, the mask configuration bits and all the memory segments 42 correspond to each other respectively. Therefore, one of the memory segments 42 of one of the memory banks 41 can be specified by corresponding one of the PASR configuration bits or the mask configuration bits.

The m×n second AND gates 324_1 to 324__m×n can be used for performing AND operation on all the corresponding PASR configuration bits and inversed mask configuration bits generated by inversing the mask configuration bits, and AND results of the m×n second AND gates 324_1 to 324__m×n can be used for controlling the first operation unit 321. In other words, under the writing mode, the first operation unit 321 adds the input address set in_addr and the address offset addr_offset to generate the mapped address set re_addr according to the AND results of the m×n second AND gates 324_1 to 324__m×n.

Similarly, the first multiplexer 331 of the address decoder 33 outputs the PASR configuration update signal p_config1 according to the mapped address set re_addr, the reading and writing signal WR and the AND results of the m×n second AND gates 324_1 to 324__m×n to update the PASR configuration p_config currently stored in the PASR configuration register 31.

Therefore, under the writing mode, the address mapper 32 firstly determines whether the value of the mask configuration bit corresponding to each of the input addresses is 1. If the value of the mask configuration bit corresponding to each of the input addresses is 1, the corresponding memory segment 42 can not be mapped. Therefore, the outputted mapped addresses are the same as the input addresses.

For the PASR configuration bits corresponding to both the mapped addresses and the mask configuration bits with a value of 1, because the written data w_data will be written to the corresponding memory segments 42, the values of the PASR configuration bits will be set to 0. If the values of the corresponding mask configuration bits are 0, it represents that the corresponding memory segments 42 can be mapped, and that the address mapper 32 can perform mapping and output the mapped addresses different from the input addresses. For the PASR configuration bits corresponding to both the mapped addresses and the mask configuration bits with a value of 0, because the written data w_data will be written to the corresponding memory segments 42, the values of the PASR configuration bits will be set to 0. Furthermore, the mask configuration m_config stored in mask register 323 can be set by other units outside the memory 40.

Figure 3D:
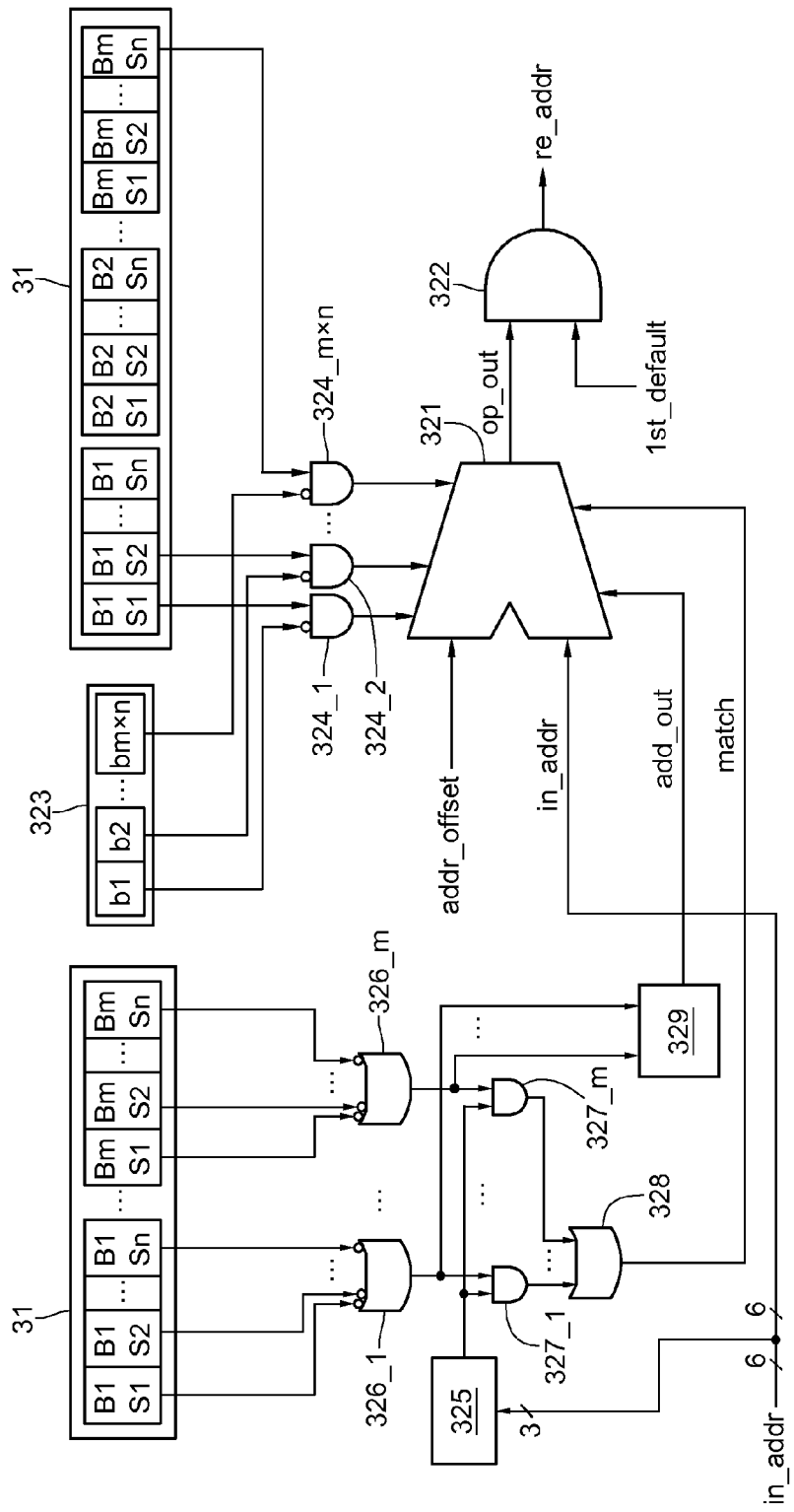
FIG. 3D is a schematic diagram of the address mapper according to an embodiment of the disclosure.
Figure 5C:
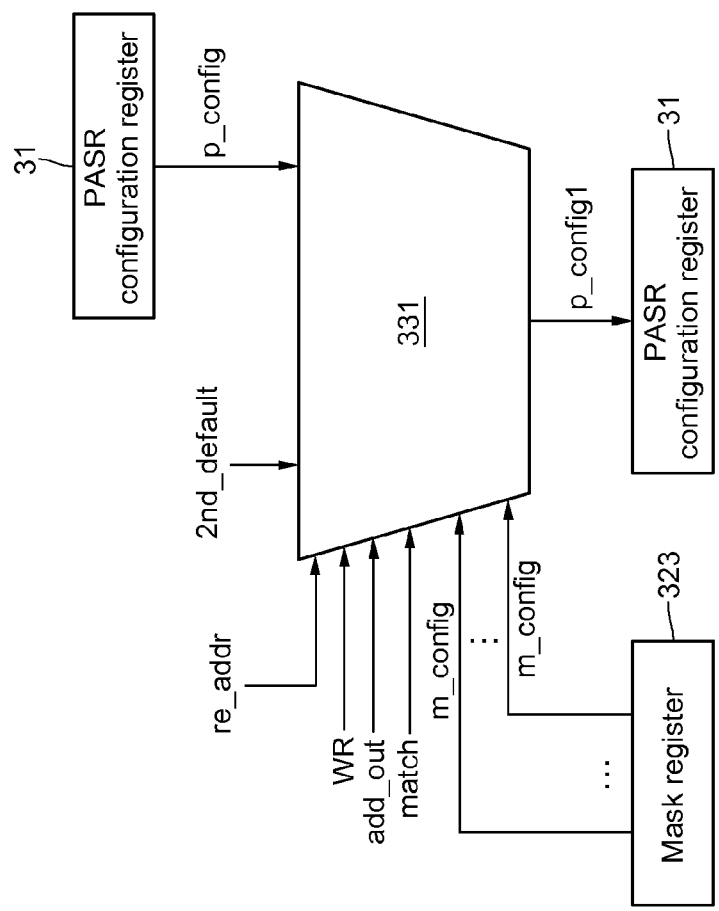
FIG. 5C is a schematic diagram of an address decoder according to an embodiment of the disclosure.

Refer to FIG. 3D and FIG. 5C, schematic diagrams of the address mapper and the address decoder according to an embodiment of the disclosure are shown. In this embodiment, the address mapper 32 further includes a first decoder 325, m first OR gates 326_1 to 326__m, m third AND gates 327_1 to 327__m, a second OR gate 328 and a first adder 329. All of the first decoder 325, the first OR gates 326_1 to 326__m, the third AND gates 327_1 to 327__m, the second OR gate 328 and the first adder 329 form a determining circuit for determining whether a quantity of the memory banks 41 stored data currently is greater than a threshold value.

The first decoder 325 can be used for generating a decoding address set according to the input address set in_addr. A quantity of input bits of the first decoder 325 and a quantity of output bits of the first decoder 325 can be set according to a value of m. In this embodiment, the first decoder 325 is, for example, a decoder for converting 3 bits to 8 bits.

The m first OR gates 326_1~326__m can be used for performing OR operation on n inversed PASR configuration bits corresponding to the n memory segments 42 belonging to the same memory bank 41, where the n inversed PASR configuration bits are generated by inversing the n PASR configuration bits. For example, the first OR gate 326_1 can correspond to the first memory bank 41. In this example, if the value of the PASR configuration bit corresponding to any one of the memory segments 42 in the first memory bank 41 is 0, it represents that the first memory bank 41 has stored data, and that the first memory bank 41 is needed to be self-refreshed when the computer is under the sleep-or-standby mode. The first adder 329 is used for adding the OR results of the m first OR gates 326_1 to 326__m to generate an updated memory bank quantity add_out for indicating a quantity of the memory banks 41 which have stored data until now, and the memory banks 41 which have stored data is needed to be self-refreshed when the computer is under the sleep-or-standby mode.

The m third AND gates 327_1 to 327__m can be used for respectively performing AND operation on the OR results of the m first OR gates 326_1 to 326__m and the decoding address set. The second OR gate 328 can be used for performing OR operation on the AND results of the m third AND gates 327_1 to 327__m to generate a matching signal match. If a value of the matching signal match is 0, it represents that the memory banks 41 corresponding to the input address set in_addr do not store any data. If a value of the matching signal match is 1, it represents that the memory banks 41 corresponding to the input address set in_addr have stored data.

The first operation unit 321 adds the input address set in_addr and the address offset addr_offset to generate the mapped address set re_addr according to the matching signal match and the updated memory bank quantity add_out. Similarly, the first multiplexer 331 of the address decoder 33 outputs the PASR configuration update signal p_config1 according to the mapped address set re_addr, the reading and writing signal WR, the matching signal match, the updated memory bank quantity add_out and the mask configuration m_config to update the PASR configuration p_config currently stored in the PASR configuration register 31.

More specifically, the address mapper 32 first determines whether the input addresses respectively correspond to the memory banks 41 which have stored data, according to the matching signal match, If yes, the value of the matching signal match is 1. Herein, the input addresses are not required to be mapped, the input addresses can be directly set as the mapped addresses, and the values of the corresponding PASR configuration bits are set to 0. If not, the value of the matching signal match is 0. Herein, the address mapper 32 further determines whether the updated memory bank quantity add_out is greater than the threshold value. Similarly, the address decoder 33 can also determine whether the input addresses respectively correspond to the memory banks 41 which have stored data, according to the matching signal match. If yes, the input addresses can be directly set as the mapped address.

If the updated memory bank quantity add_out is less than the threshold value, the input addresses can also be directly set as the mapped addresses, and the address decoder 33 can set the values of the corresponding PASR configuration bits to 0. If the updated memory bank quantity add_out is greater than or equal to the threshold value, it represents that there is a considerable quantity of the memory banks 41 which have stored data. In order to reduce a quantity of the used memory banks 41, the input addresses can be mapped to the mapped addresses corresponding to the used memory banks 41, and the address decoder 33 can set the values of the PASR configuration bits corresponding to the mapped addresses to 0. In other words, the mapped addresses are in the limited range corresponding to the memory banks 41 which have been used.

According to an embodiment, the OR results of the m first OR gates 326_1 to 326_m can be provided to the address mapper 32 directly. The address mapper 32 can learn the conditions of each of the used memory banks 41 according to the OR results of the m first OR gates 326_1 to 326_m, and can determine whether it is needed to map the input addresses, according to the conditions. Assume that the unused memory segments 42 are required to be located in memory regions at lower addresses. The limited range can oppositely be set to the memory regions at higher addresses. If the input addresses correspond to the memory regions at lower addresses, the input addresses can be mapped as the mapped addresses of the memory regions at higher addresses, and the written data w_data can be written to the memory regions at higher addresses.

Figure 6:
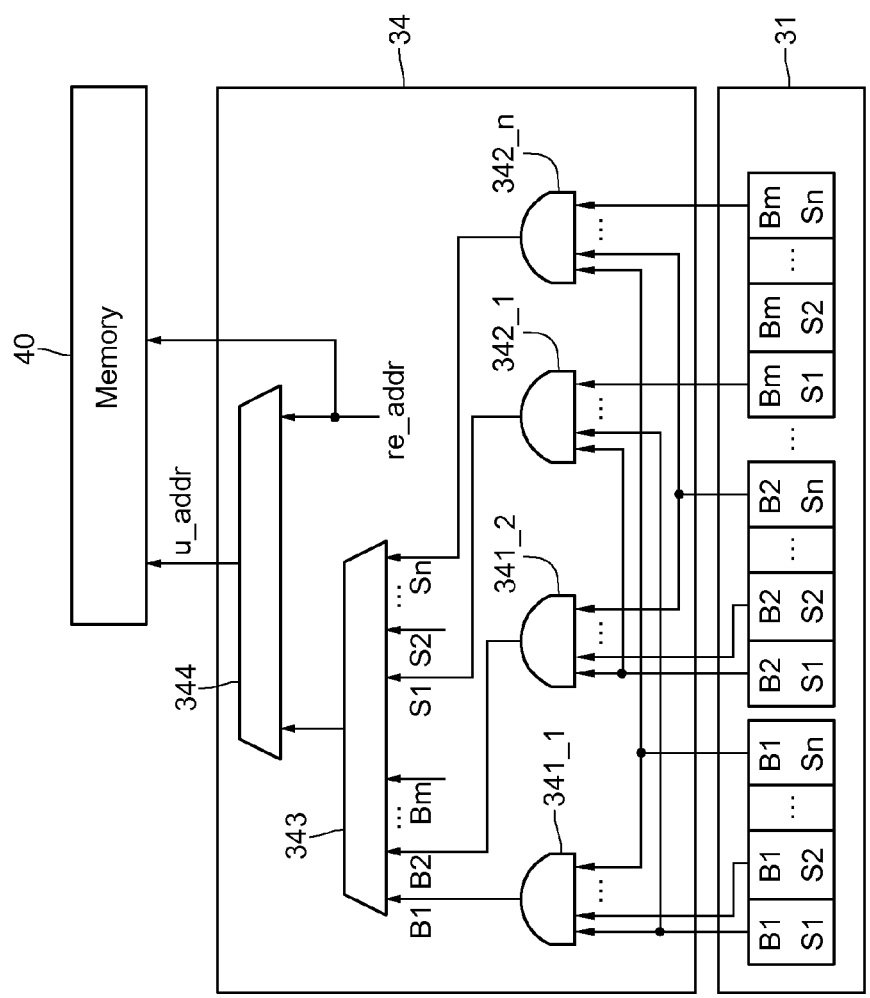
FIG. 6 is a schematic diagram of an address selector according to an embodiment of the disclosure.

FIG. 6 is a schematic diagram of the address selector according to an embodiment of the disclosure. When the computer is under the normal mode (the memory 40 is under the reading mode or the writing mode), the address selector 34 receives the mapped address set re_addr and outputs the updated address set u_addr in order to access the memory 40. When the computer is under the sleep-or-standby mode, the address selector 34 generates the updated address set u_addr according to the PASR configuration. The address selector 34 can also set at least one of the mode registers 43 of the memory 40 according to the updated address set u_addr, so that the memory 40 can self refresh at least one of the memory segments 42 correspondingly.

The address selector 34 includes m fourth AND gates 341_1 to 341_m (collectively called fourth AND gates 341), n fifth AND gates 342_1 to 342_n (collectively called fifth AND gates 342), a second multiplexer 343 and a third multiplexer 344.

The m fourth AND gates 341_1 to 341_m are used for performing AND operation on the n updated PASR configuration bits corresponding to the n memory segments 42 belonging to the same memory bank 41. When the values of the updated PASR configuration bits corresponding to any one of the memory segments 42 in the memory bank 41 are 0, it represents that the memory segment 42 is needed to be self-refreshed. Herein, an output of the fourth AND gate 341 corresponding to the memory bank 41 will be 0.

The n fifth AND gates 342_1 to 342_n are used for performing AND operation on the m updated PASR configuration bits corresponding to the m memory segments 42 belonging to the same index of memory segment in the m memory banks 41. In other words, the ith fifth AND gate 342 can perform AND operation on the m updated PASR configuration bits corresponding to the ith memory segment 42 (totally m memory segments 42) in each of the memory banks 41, where i is an integer, and 1≤i≤n. For example, when the values of the updated PASR configuration bits corresponding to any one of the ith memory segments 42 of all the memory banks 41 are 0, an output of the fifth AND gate 342 corresponding to the ith memory segment 42 will be 0.

The second multiplexer 343 is used for outputting a first signal according to the AND results of the m fourth AND gates 341_1 to 341_m and the AND results of the n fifth AND gates 342_1 to 342_n. The third multiplexer 344 is used for generating the updated address set u_addr according to the first signal and the mapped address set re_addr. The updated address set u_addr includes at least one updated address. Under the normal mode, the address selector 34 is used for receiving the mapped address set re_addr to generate the control address set used for accessing the memory 40. Under the sleep-or-standby mode, the address selector 34 is used for receiving the output signal of the second multiplexer 343 to generate the updated address set u_addr which is used for setting at least one of the mode registers 43 of the memory 40, so that the memory 40 can self refresh at least one of the memory segments 42 correspondingly.

Through the above elements, the memory controlling device 30 can learn the setting information of each of the memory banks 41 and the memory segments 42 according to the PASR configuration p_config, and set the commands for executing the PASR function through the address selector 34 and the controller 35. The controller 35 can send the commands for executing the PASR function to the memory 40, so that the memory 40 enters into a PASR mode according to the commands, and set at least one of the mode registers 43 of the memory 40 according to the updated address set u_addr to perform self refreshing.

As a conclusion from the above, under the reading mode, the PASR configuration p_config is not modified, and the operations of the address mapper 32, the address selector 34, the controller 35 and the memory 40 are described as follows. The address mapper 32 generates the mapped addresses according to the input addresses. The address selector 34 and the controller 35 read the read data r_data from the memory 40 according to the mapped addresses and transmit the read data r_data to the external bus 52.

Under the writing mode, the operations of the address mapper 32, the address decoder 33, the address selector 34, the controller 35 and the memory 40 are described as follows. The address mapper 32 generates the mapped addresses according to the input addresses. The address decoder 33 outputs the PASR configuration update signal p_config1 according to the mapped addresses to update the PASR configuration p_config currently stored in the PASR configuration register 31. The controller 35 receives the written data w_data from the external bus 52, and then the address selector 34 and the controller 35 write the written data w_data to the memory 40 according to the mapped addresses.

Under the sleep-or-standby mode, the operations of the address selector 34, the controller 35 and the memory 40 are described as follows. The address selector 34 sets at least one of the mode registers 43 of the memory 40 according to the PASR configuration p_config, so that the memory 40 can self refresh at least one of the memory segments 42 correspondingly. The controller 35 can send out commands to the memory 40 to control the memory 40 to enter into the PASR mode to self refresh the memory segments 42 corresponding to the PASR configuration p_config.

Figure 7:
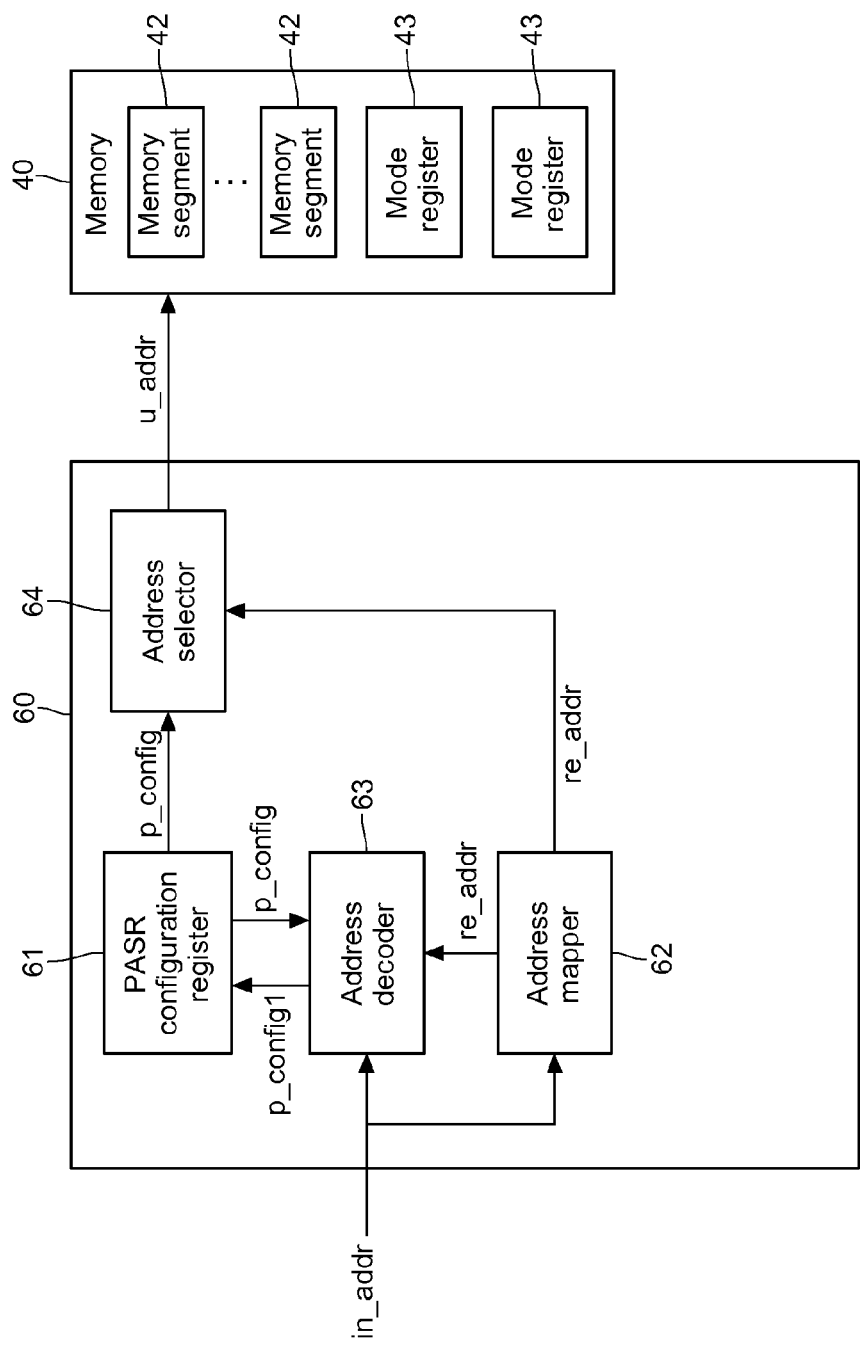
FIG. 7 is a block diagram of the memory controlling device according to an embodiment of the disclosure.

FIG. 7 is a block diagram of the memory controlling device according to an embodiment of the disclosure. According to an embodiment, a memory controlling device 60 includes a PASR configuration register 61, an address mapper 62, an address decoder 63 and an address selector 64. The address mapper 62 can be embodied by look-up tables.

The PASR configuration register 61 is used for storing the PASR configuration p_config. The PASR configuration p_config includes a plurality of PASR configuration bits, and the PASR configuration bits correspond to the memory segments 42 respectively.

The address mapper 62 is coupled to the address decoder 63 and the address selector 64. Under the normal mode, the address mapper 62 receives the input address set in_addr and a plurality of default addresses, converts the input address set in_addr, the default addresses and a plurality of look-up addresses into the mapped address set re_addr according to the input address set in_addr, and outputs the mapped address set re_addr. The mapped address set re_addr includes at least one mapped address in a limited range, or includes a plurality of successive mapped addresses.

The address decoder 63 is coupled to the PASR configuration register 61 and the address mapper 62. The address decoder 63 is used for receiving the input address set in_addr, the PASR configuration p_config and a mapped status under the writing mode, and outputting the PASR configuration update signal p_config1 according to the input address set in_addr, the PASR configuration p_config and the mapped status to update the PASR configuration p_config currently stored in the PASR configuration register 61.

The address selector 64 is coupled to the memory 40, the PASR configuration register 61 and the address mapper 62. The address selector 64 receives the mapped address set re_addr to generate the updated address set u_addr used for accessing the memory 40 when the computer is under the normal mode (the memory 40 is under the reading mode or the writing mode). The address selector 64 receives the updated PASR configuration p_config to generate the updated address set u_addr when the computer is under the sleep-or-standby mode. The address selector 64 sets at least one of the mode registers 43 of the memory 40 according to the updated address set u_addr, so that the memory 40 can self refresh at least one of the memory segments 42 correspondingly.

A difference between the memory controlling device 60 and the memory controlling device 30 lies in that the address mapper 62 performs the address mapping by look-up tables. The operations of the PASR configuration register 61, the address decoder 63 and the address selector 64 are similar to those of the PASR configuration register 31, the address decoder 33 and the address selector 34, thereby being not mentioned herein again.

Figure 8:
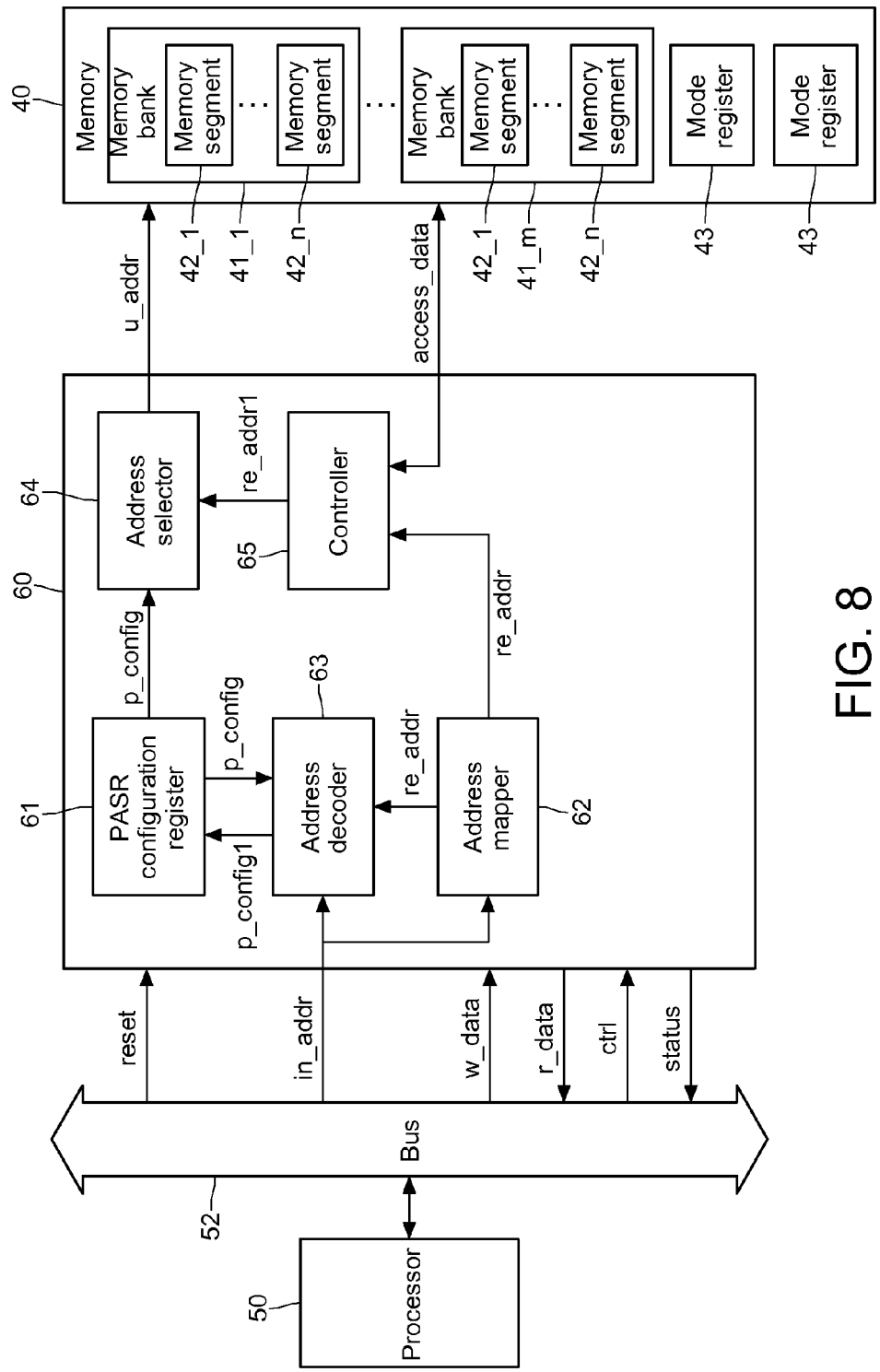
FIG. 8 is a block diagram of the memory controlling device according to an embodiment of the disclosure.

FIG. 8 is a block diagram of the memory controlling device according to an embodiment of the disclosure. The memory controlling device 60 can further comprise a controller 65 as compared with the memory controlling device 60 in FIG. 7. The operation of the controller 65 is similar to that of the previously mentioned controller 35. The controller 65 is coupled between the address mapper 62 and the address selector 64, and is coupled to the memory 40. The controller 65 can be used for receiving the mapped address set re_addr from the address mapper 62, and for transmitting the transmitted mapped address set re_addr1 to the address selector 64.

The address selector 64 receives the transmitted mapped address set re_addr1 to generate the updated address set u_addr used for accessing the memory 40 when the computer is under the normal mode (the memory 40 is under the reading mode or the writing mode). The address selector 64 receives the updated PASR configuration p_config to generate the updated address set u_addr under the sleep-or-standby mode. The address selector 64 sets at least one of the mode registers 43 of the memory 40 according to the updated address set u_addr, so that the memory 40 can self refresh at least one of the memory segments 42 correspondingly.

The memory 40 includes m memory banks 41, each of the m memory banks 41 includes n memory segments 42, and m and n are positive integers. The memory segment 42 is, for example, the smallest access unit used by the memory 40.

Figure 9A:
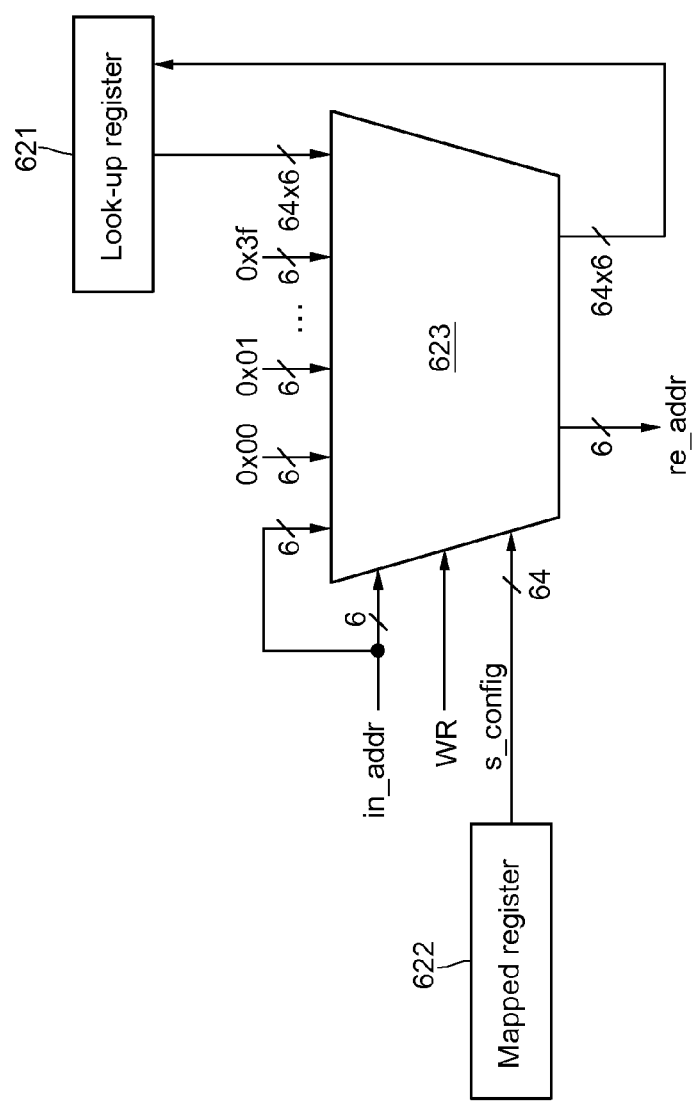
FIG. 9A is a schematic diagram of the address mapper according to an embodiment of the disclosure.

FIG. 9A is a schematic diagram of the address mapper according to an embodiment of the disclosure. The address mapper 62 includes a look-up register 621, a mapped register 622 and a fourth multiplexer 623.

The look-up register 621 can be used for storing a look-up address set, and the look-up address set includes at least one look-up address. The look-up address can be the mapped address previously generated by the address mapper 62, be stored in the look-up register 621, and be used for subsequent reading or writing. In this embodiment, the look-up register 621 can be regarded as a look-up table (LUT), and the memory controlling device 60 can obtain the corresponding mapped address by looking up the look-up table according to the input address served as an index.

The mapped register 622 can be used for storing a mapped configuration s_config, and the mapped configuration s_config includes a plurality of mapped configuration bits. The mapped configuration bits correspond to indexes of the look-up addresses respectively, and are used for indicating whether the corresponding look-up addresses have been mapped. For example, when a value of the mapped configuration bit is 1, it represents that the look-up address corresponding to the mapped configuration bit has been mapped. Herein, the corresponding look-up address may be different from the input address that is used for generating the look-up address. Each of the look-up addresses corresponds to a unique index. For example, the indexes respectively corresponding to the look-up addresses 0x00 to 0x3f are 1 to 64.

According to an embodiment, an initialized value of each of the look-up addresses of the look-up address set can be the same as the corresponding index value. If one of the input addresses is mapped to the mapped address by the address mapper 62, the mapped address can be set as the look-up address corresponding to the input address, and the mapped configuration bit corresponding to the input address can be set to 1.

The fourth multiplexer 623 can be used for converting the input address set in_addr, the default addresses and the look-up addresses into the mapped address set re_addr according to the mapped configuration bits and the input address set in_addr, and for outputting the mapped address set re_addr to the controller 65. The fourth multiplexer 623 further updates the look-up address set according to the mapped address set re_addr and writes the updated look-up address set back to the look-up register 621.

The default addresses can respectively correspond to all the memory segments 42 in the memory 40. For example, when both m and n are 8, there are a total of 64 memory segments 42 and the default addresses can be 0x00 to 0x3f. According to an embodiment, the fourth multiplexer 623 selects the consecutive addresses from the lowest address to the highest address in the default addresses sequentially, and sets the selected ones as the new mapped addresses. Assume the fourth multiplexer 623 receives the input address set in_addr including the three input addresses 0x00, 0x10 and 0x30, the addresses 0x00, 0x01 and 0x02 can be selected to be set as the corresponding mapped addresses.

When the address mapper 62 receives the input address set in_addr, the address mapper 62 can firstly determine whether the input addresses have been mapped, according to the mapped configuration bits corresponding to each of the input addresses. If the mapped configuration bit corresponding to one the input address is 1, it represents that the input address has been mapped already. Therefore, the fourth multiplexer 623 can acquire a look-up address corresponding to the input address, from the look-up register 621 and output the acquired look-up address as the mapped address.

If the mapped configuration bit corresponding to one input addresses is 0, it represents that the input address has not been mapped. Herein, the fourth multiplexer 623 will determine which of the default addresses has been used, according to the mapped configuration s_config, and will select the lowest default address in the unused default addresses to output it as the mapped address. Similarly, if the mapped configuration bits corresponding to the input addresses are 0, the fourth multiplexer 623 will select the consecutive default addresses in the unused default addresses in order from the lowest default address, and then outputs the selected ones as the mapped addresses.

Figure 9B:
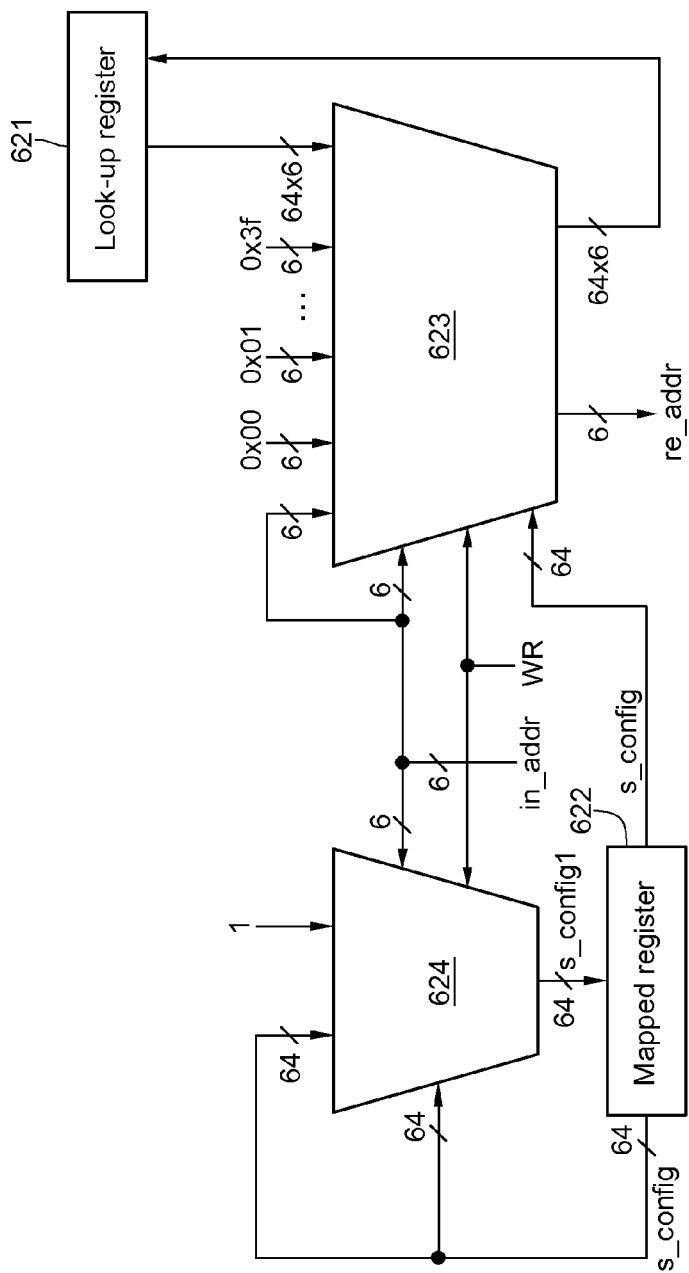
FIG. 9B is a schematic diagram of the address mapper according to an embodiment of the disclosure.

FIG. 9B is a schematic diagram of the address mapper according to an embodiment of the disclosure. The address mapper 62 further includes a fifth multiplexer 624. The fifth multiplexer 624 can be used for outputting a mapped configuration update signal s_config_1 according to the mapped configuration s_config, the reading and writing signal WR and the input address set in_addr to update the mapped configuration s_config stored in the mapped register 622. When the address mapper 62 receives the unmapped input address, the address mapper 62 can generate the corresponding mapped address and set the mapped configuration bit corresponding to the unmapped input address to 1 for updating.

Figure 10A:
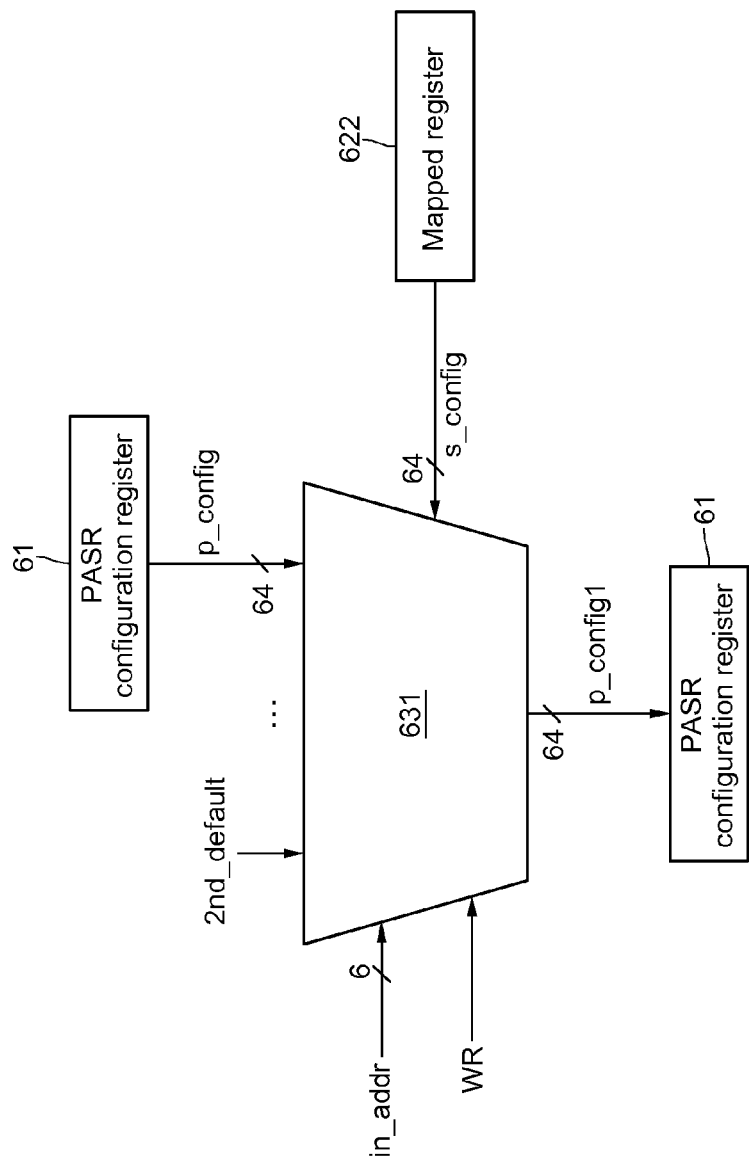
FIG. 10A is a schematic diagram of the address decoder according to an embodiment of the disclosure.

Please refer to FIG. 10A. FIG. 10A is a schematic diagram of the address decoder according to an embodiment of the disclosure. The address decoder 63 includes a first multiplexer 631 for converting the currently stored PASR configuration p_config into the PASR configuration update signal p_config1 according to the input address set in_addr, the mapped configuration s_config and the reading and writing signal WR to update the PASR configuration p_config currently stored in the PASR configuration register 61. Each of the updated PASR configuration bits can be the second default signal 2nd_default, or be the corresponding PASR configuration bit before updating.

In this embodiment, the initial values of all the PASR configuration bits can be 1, which represents that all the memory segments 42 of the memory 40 are not needed to be self-refreshed at the startup of the memory segments 42. Herein, the second default signal 2nd_default can be set to 0. In the writing mode, the updated PASR configuration bits corresponding to the mapped address set re_addr are set to 0. In the reading mode, the PASR configuration p_config is not needed to be updated. An example of address mapping results is described as follows.

Assume that the memory banks 41 and the memory segments 42 corresponding to the input address set in_addr are shown in Table 1:

TABLE 1

|    | b1 | b2 | b3 | b4 | b5 | b6 | b7 | b8 |
|----|----|----|----|----|----|----|----|----|
| s1 | 1  |    |    |    | 2  |    | 6  |    |
| s2 | 3  | 4  |    |    |    |    | 5  |    |
| s3 |    |    |    |    | 7  | 8  |    | 11 |
| s4 | 12 |    |    |    |    |    |    |    |
| s5 |    | 9  |    |    |    |    |    |    |
| s6 |    |    |    |    |    |    |    |    |
| s7 | 13 |    |    |    |    |    |    |    |
| s8 | 14 | 10 | 15 |    |    |    |    |    |

In Table 1, b1 to b8 represent the first to the eighth memory banks 41, s1 to s8 represent the first to the eighth memory segments 42, and the numerals 1 to 15 represent the sequence of segments being accessed. In other words, the first input address corresponds to b1s1, the second input address corresponds to b4s1, the fifteenth input address corresponds to b3s8, and the rest can be deduced by analogy. As shown in Table 1, if the written data w_data is written to the memory 40 according to the input address set in_addr, each of the memory banks 41 will be accessed. However, for the memory segments 42, only the sixth memory segment 42 of each of the memory banks 41 is not accessed. Therefore, under the sleep-or-standby mode, electricity supply for the memory segments 42 except the sixth memory segment 42 of each of the memory banks 41 has to be maintained for performing the PASR function.

After the mapped address set re_addr is generated by the address mapper 62 and the written data w_data is written to the memory 40 according to the mapped address set re_addr, the address mapping result is shown in Table 2 below:

TABLE 2

|    | b1 | b2 | b3 | b4 | b5 | b6 | b7 | b8 |
|----|----|----|----|----|----|----|----|----|
| s1 | 1  | 2  | 3  | 4  | 5  | 6  | 7  | 8  |
| s2 | 9  | 10 | 11 | 12 | 13 | 14 | 15 |    |
| s3 |    |    |    |    |    |    |    |    |
| s4 |    |    |    |    |    |    |    |    |
| s5 |    |    |    |    |    |    |    |    |
| s6 |    |    |    |    |    |    |    |    |
| s7 |    |    |    |    |    |    |    |    |
| s8 |    |    |    |    |    |    |    |    |

In Table 2, the second to the fifth and the seventh to the fifteenth input addresses are different from their corresponding mapped addresses. As shown in Table 2, for the memory segments 42, only the first and the second memory segments 42 of the first to the seventh memory banks 41 are accessed, and the first memory segment 42 of the eighth memory bank 41 is accessed. Therefore, under the sleep-or-standby mode, the memory segments 42 of each of the memory banks 41 are used as a unit, and electricity supply for all the third to the eighth memory segments 42 is stopped in order to reduce the power consumption under the sleep-or-standby mode.

Figure 9C:
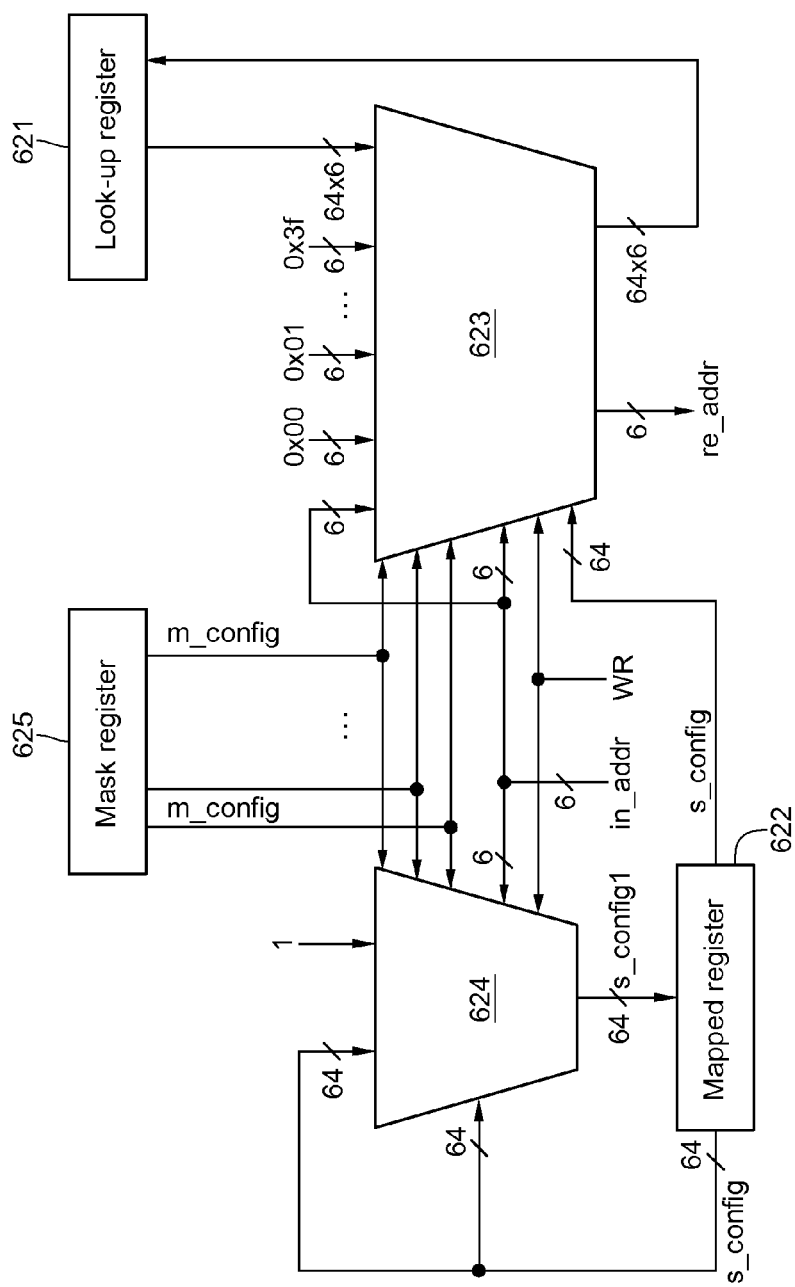
FIG. 9C is a schematic diagram of the address mapper according to an embodiment of the disclosure.
Figure 10B:
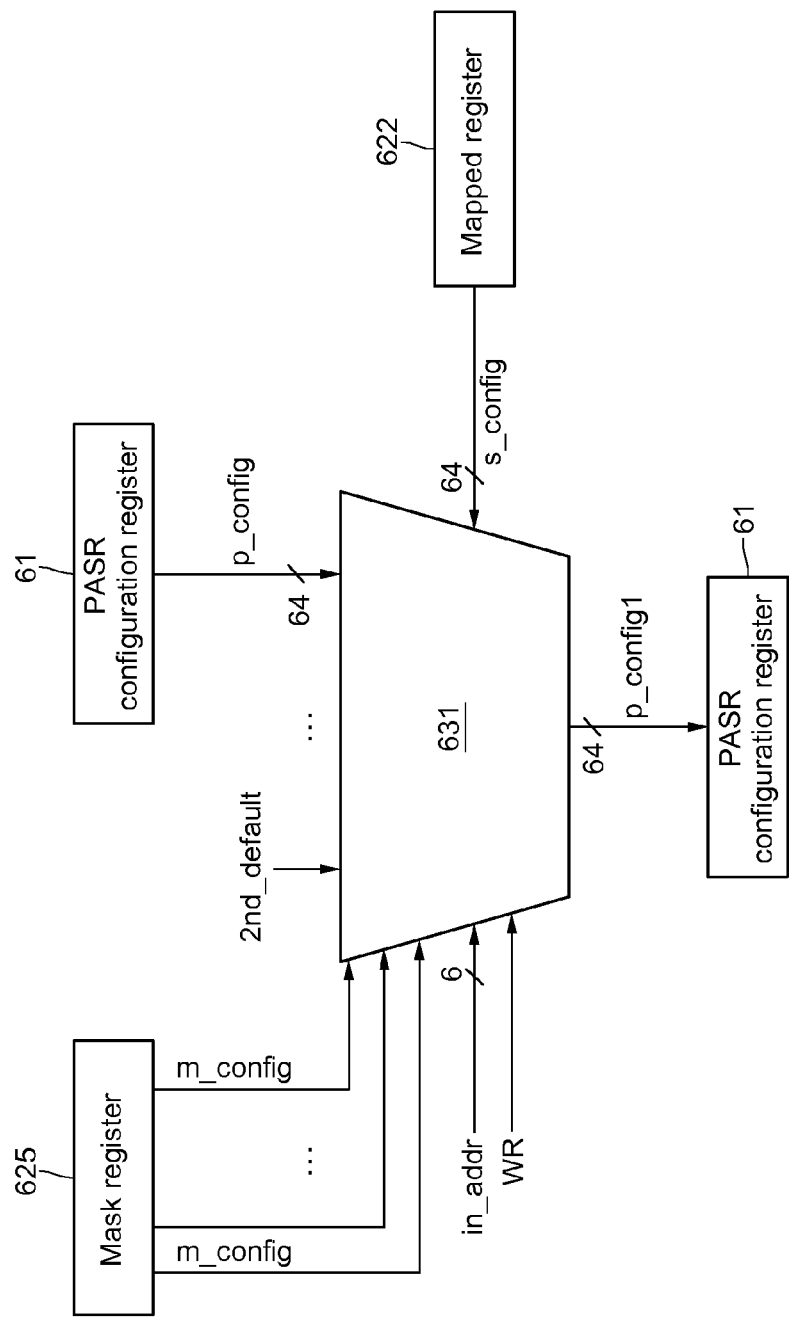
FIG. 10B is a schematic diagram of the address decoder according to an embodiment of the disclosure.

FIGS. 9C and 10B are schematic diagrams of the address mapper and the address decoder according to an embodiment of the disclosure. The address mapper 62 further includes a mask register 625 for protecting specific system data. The mask register 625 can be used for storing the mask configuration m_config. Each of the mask configuration bits indicates whether the memory segment specified by the corresponding PASR configuration bit is allowable to be mapped. Furthermore, the mask configuration m_config stored in mask register 625 can be set by other units outside the memory 40.

The fourth multiplexer 623 converts the input address set in_addr, the default addresses and the look-up register 621 into the mapped address set re_addr according to the mapped configuration s_config, the reading and writing signal WR, the input address set in_addr and the mask configuration m_config. The fifth multiplexer 624 outputs the mapped configuration update signal s_config1 according to the mapped configuration s_config, the reading and writing signal WR, the input address set in_addr and the mask configuration m_config to update the mapped configuration s_config currently stored in the mapped register 622.

The address decoder 63 includes the first multiplexer 631 for outputting the PASR configuration update signal p_config1 according to the input address set in_addr, the reading and writing signal WR and the mask configuration m_config to update the PASR configuration p_config currently stored in the PASR configuration register 61.

Figure 9D:
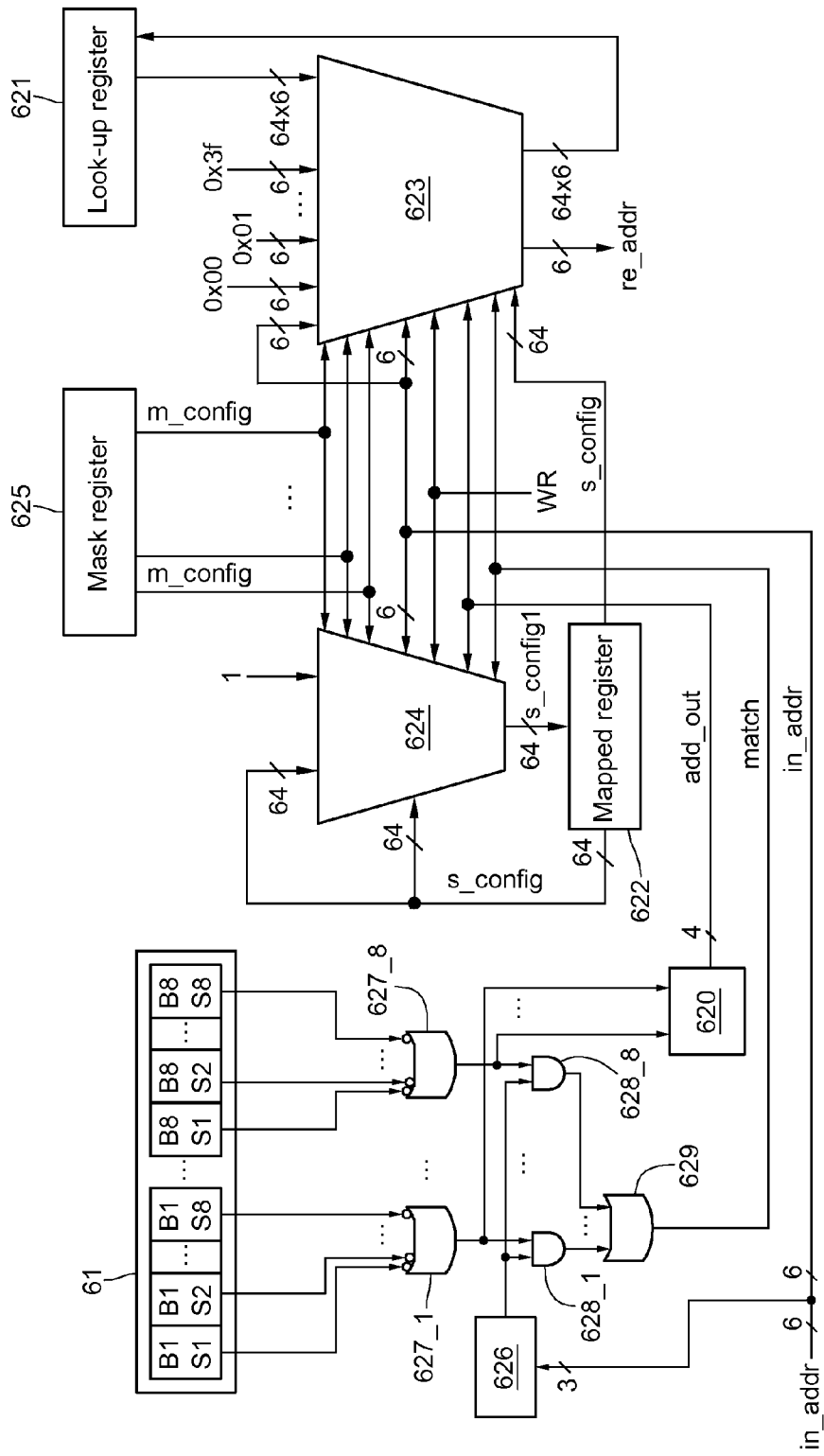
FIG. 9D is a schematic diagram of the address mapper according to an embodiment of the disclosure.
Figure 10C:
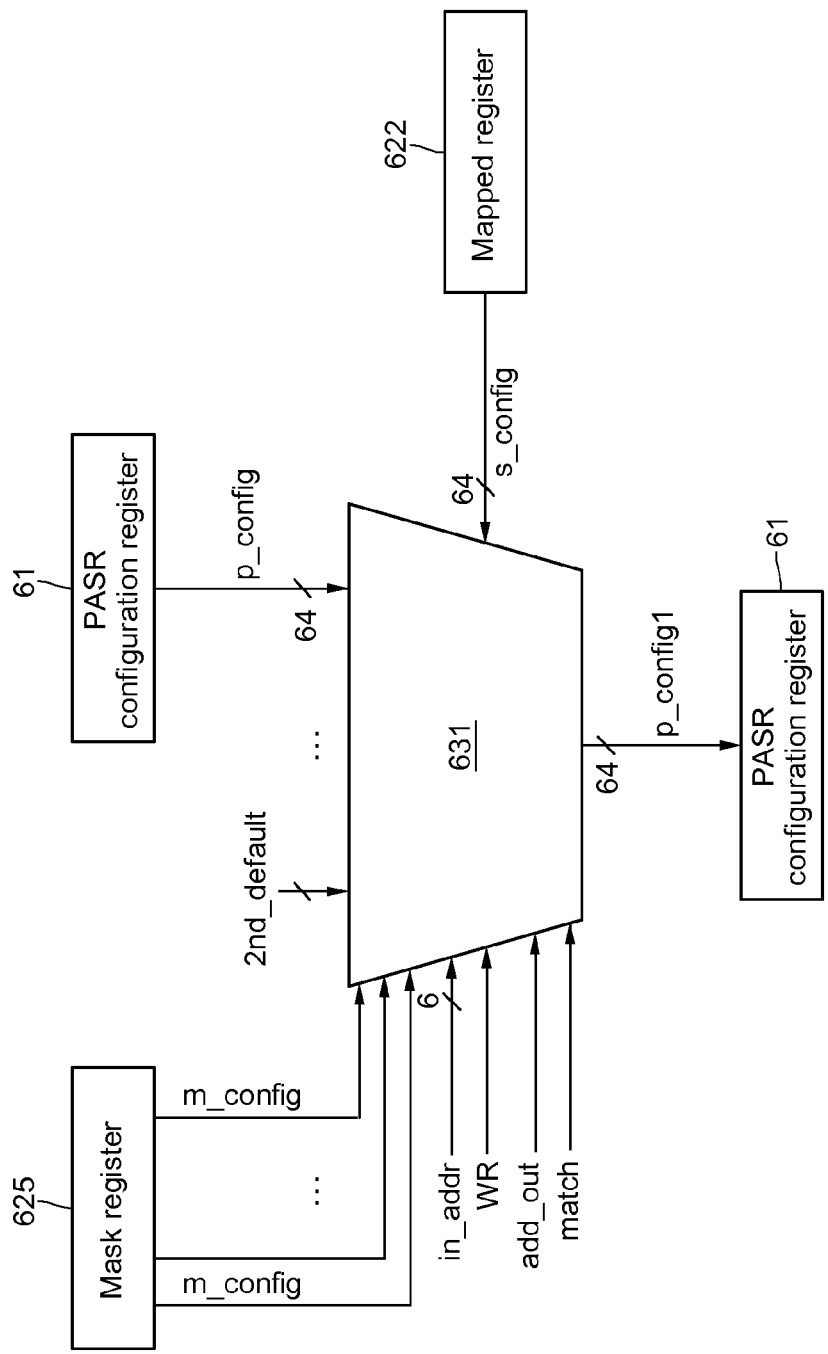
FIG. 10C is a schematic diagram of the address decoder according to an embodiment of the disclosure.

FIGS. 9D and 10C are schematic diagrams of the address mapper and the address decoder according to an embodiment of the disclosure. Both m and n are 8. The address mapper 62 further includes a first decoder 626, eight first OR gates 627_1 to 627_8, eight third AND gates 628_1 to 628_8, a second OR gate 629 and a first adder 620. By using this determining circuit, the memory controlling device 60 generates the mapped addresses according to the default addresses only when a quantity of the memory banks 41 into which data is written until now is greater than or equal to a threshold value.

The operations of the first decoder 626, the eight first OR gates 627_1 to 627_8, the eight third AND gates 628_1 to 628_8, the second OR gate 629 and the first adder 620 are similar to those of the first decoder 325, the m first OR gates 326_1 to 326_*m*, the m third AND gates 327_1 to 327_*m*, the second OR gate 328 and the first adder 329 mentioned previously, and therefore will not be described herein again. The first multiplexer 631 of the address decoder 63 outputs the PASR configuration update signal p_config1 according to the input address set in_addr, the reading and writing signal WR, the mapped configuration s_config, the matching signal match and the updated memory bank quantity add_out to update the PASR configuration p_config currently stored in the PASR configuration register 61.

An example of address mapping result is listed in Table 3 below, which assumes that the memory banks 41 and the memory segments 42 corresponding to the input address set in_addr are shown in Table 1 above, and that the threshold value of the updated memory bank quantity add_out is set to 4. After the mapped address set re_addr is generated by the address mapper 62 and the written data w_data is written to the memory 40 according to the mapped address set re_addr, the address mapping result is shown in Table 3 below:

TABLE 3

|    | b1 | b2 | b3 | b4 | b5 | b6 | b7 | b8 |
|----|----|----|----|----|----|----|----|----|
| s1 |    | 1  |    | 6  |    |    | 2  |    |
| s2 | 3  |    | 4  |    |    |    |    | 5  |
| s3 | 8  |    | 11 |    | 7  |    |    |    |
| s4 | 12 |    |    |    |    |    |    |    |
| s5 |    |    |    | 9  |    |    |    |    |
| s6 |    |    |    |    |    |    |    |    |
| s7 |    | 13 |    |    |    |    |    |    |
| s8 |    | 14 |    | 10 |    | 15 |    |    |

In Table 3, the sixth, the eighth, the eleventh and the fifteenth input addresses are different from their corresponding mapped addresses. As shown in Table 3, because a quantity of the used memory banks 41 can be limited by setting the threshold value, the used memory banks 41 are in the memory banks b1, b2, b4 and b7. Therefore, under the sleep-or-standby mode, electricity supply for the memory banks b3, b5, b6 and b8 can be stopped in order to reduce the power consumption under the sleep-or-standby mode.

Figure 11:
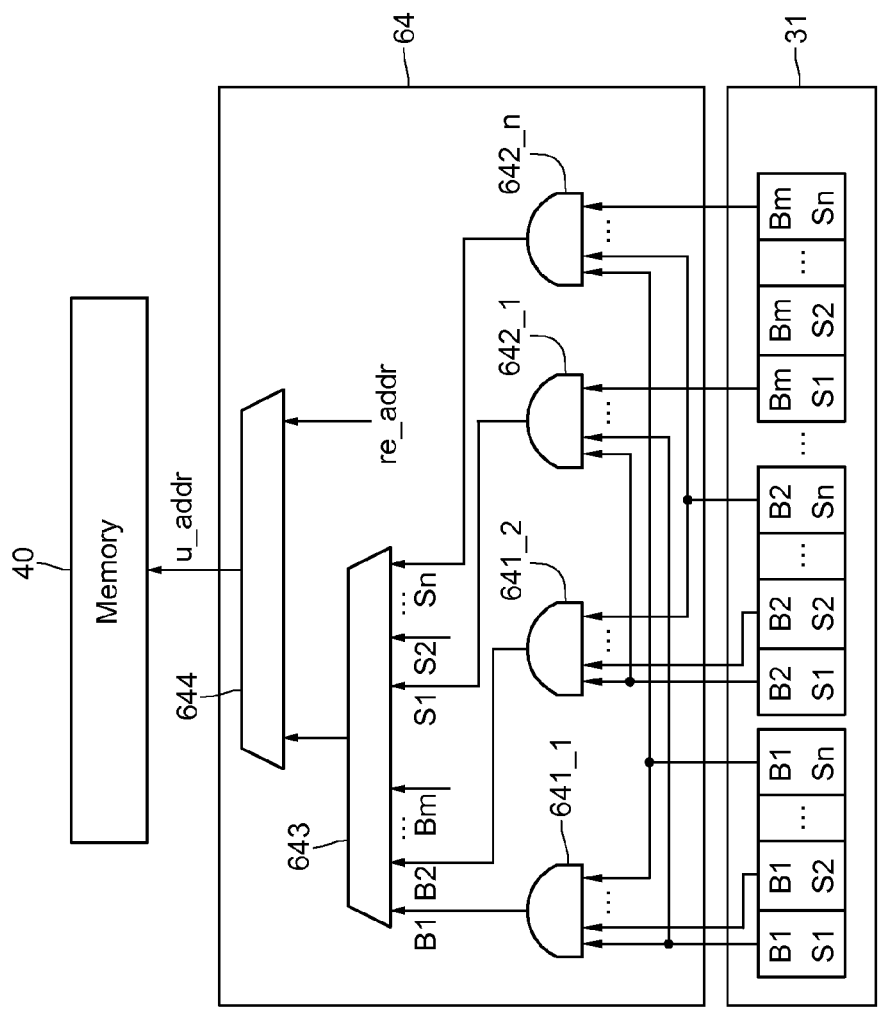
FIG. 11 is a schematic diagram of the address selector according to an embodiment of the disclosure.

FIG. 11 is a schematic diagram of the address selector according to an embodiment of the disclosure. The address selector 64 includes m fourth AND gates 641_1 to 641_*m*, n fifth AND gates 642_1 to 642_*n*, a second multiplexer 643 and a third multiplexer 644. The operations of the m fourth AND gates 641_1 to 641_*m*, the n fifth AND gates 642_1 to 642_*n*, the second multiplexer 643 and the third multiplexer 644 are similar to those of the m fourth AND gates 341_1 to 341_*m*, the n fifth AND gates 342_1 to 342_*n*, the second multiplexer 343 and the third multiplexer 344 in the address selector 34.

Under the normal mode, the address selector 64 receives the mapped address set re_addr to generate the updated address set u_addr used for accessing the memory 40. The address selector 64 receives the updated PASR configuration p_config to generate the updated address set u_addr under the sleep-or-standby mode. The address selector 64 sets at least one mode register 43 of the memory 40 according to the updated address set u_addr, so that the memory 40 can self refresh at least one memory segment 42 correspondingly.

As set forth above, in the reading mode, the PASR configuration p_config will not be changed, and the controller 65 can read an access data access_data in the memory 40 according to the mapped address, set the read access data access_data as the read data r_data, and send to the external bus 52. In the writing mode, the address mapper 62 generates the consecutive mapped addresses or the mapped addresses in a limited range according to the input addresses. The address decoder 63 updates the PASR configuration p_config according to the input addresses. The controller 65 receives the written data w_data from the external bus 52 and writes the written data w_data to the memory 40 according to the mapped addresses.

Under the sleep-or-standby mode, the address selector 64 generates the updated address set u_addr according to the PASR configuration p_config in order to set at least one mode register 43 of the memory 40, so that the memory 40 can self refresh at least one memory segment 42 correspondingly. The controller 65 can send out commands to the memory 40 to control the memory 40 to enter into the PASR mode to self refresh the memory segments 42 corresponding to the PASR configuration p_config.

Figure 12:
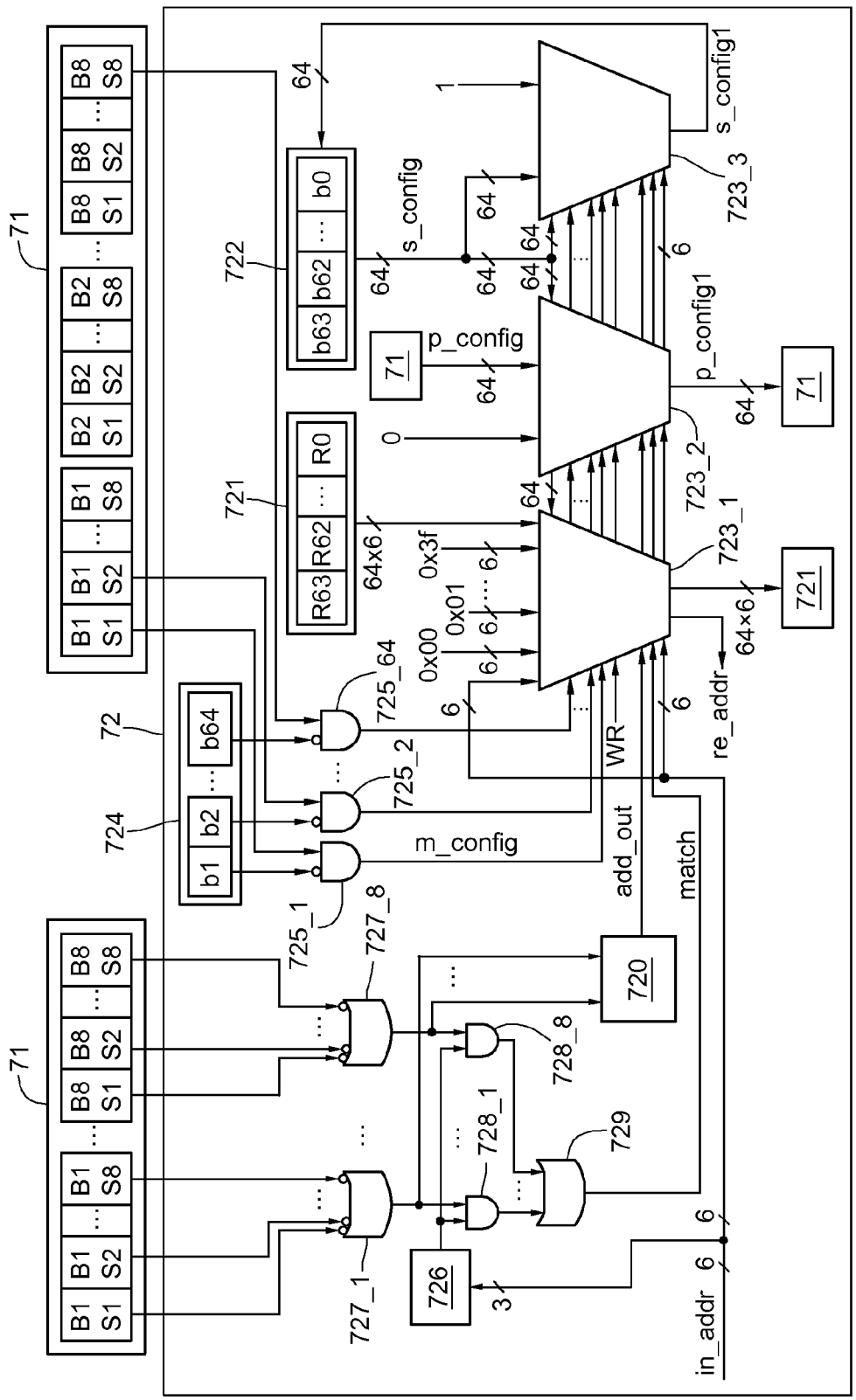
FIG. 12 is a schematic diagram of the address mapper according to an embodiment of the disclosure.

Furthermore, logic circuits of the address mapper 62 and the address decoder 63 can be combined to form an address mapper 72 as shown in FIG. 12, which has the functions of the address mapper 62 in FIG. 9D and the address decoder 63 in FIG. 10C. In this embodiment in FIG. 12, both m and n are 8.

The address mapper 72 can be coupled to a PASR configuration register 71. The address mapper 72 includes a look-up register 721, a mapped register 722, a sixth multiplexer 723_1, a seventh multiplexer 723_2, an eighth multiplexer 723_3, a mask register 724, 8×8 sixth AND gates 725_1 to 725_8×8, a first decoder 726, eight first OR gates 727_1 to 727_8, eight third AND gates 728_1 to 728_8, a second OR gate 729 and a first adder 720.

The sixth multiplexer 723_1 generates the mapped address set re_addr and updates the look-up register 721 according to the mapped configuration s_config, data in the look-up register 721, the reading and writing signal WR, the input address set in_addr, the default addresses, the matching signal match, the updated memory bank quantity add_out and the outputs of the m×n sixth AND gates 725_1 to 725_8×8.

The seventh multiplexer 723_2 outputs the PASR configuration update signal p_config1 to update the PASR configuration p_config currently stored in the PASR configuration register 71, according to the mapped configuration s_config, the input address set in_addr, the reading and writing signal WR, the matching signal match, the updated memory bank quantity add_out and the outputs of the sixty-four (8×8=64) sixth AND gates 725_1 to 725_*m*×*n*. The eighth multiplexer 723_3 outputs the mapped configuration update signal s_config1 to update the mapped configuration s_config currently stored in the mapped register 722, according to the mapped configuration s_config, the reading and writing signal WR, the input address set in_addr, the matching signal match, the updated memory bank quantity add_out and the outputs of the sixty-four (8×8=64) sixth AND gates 725_1 to 725_64.

Figure 13:
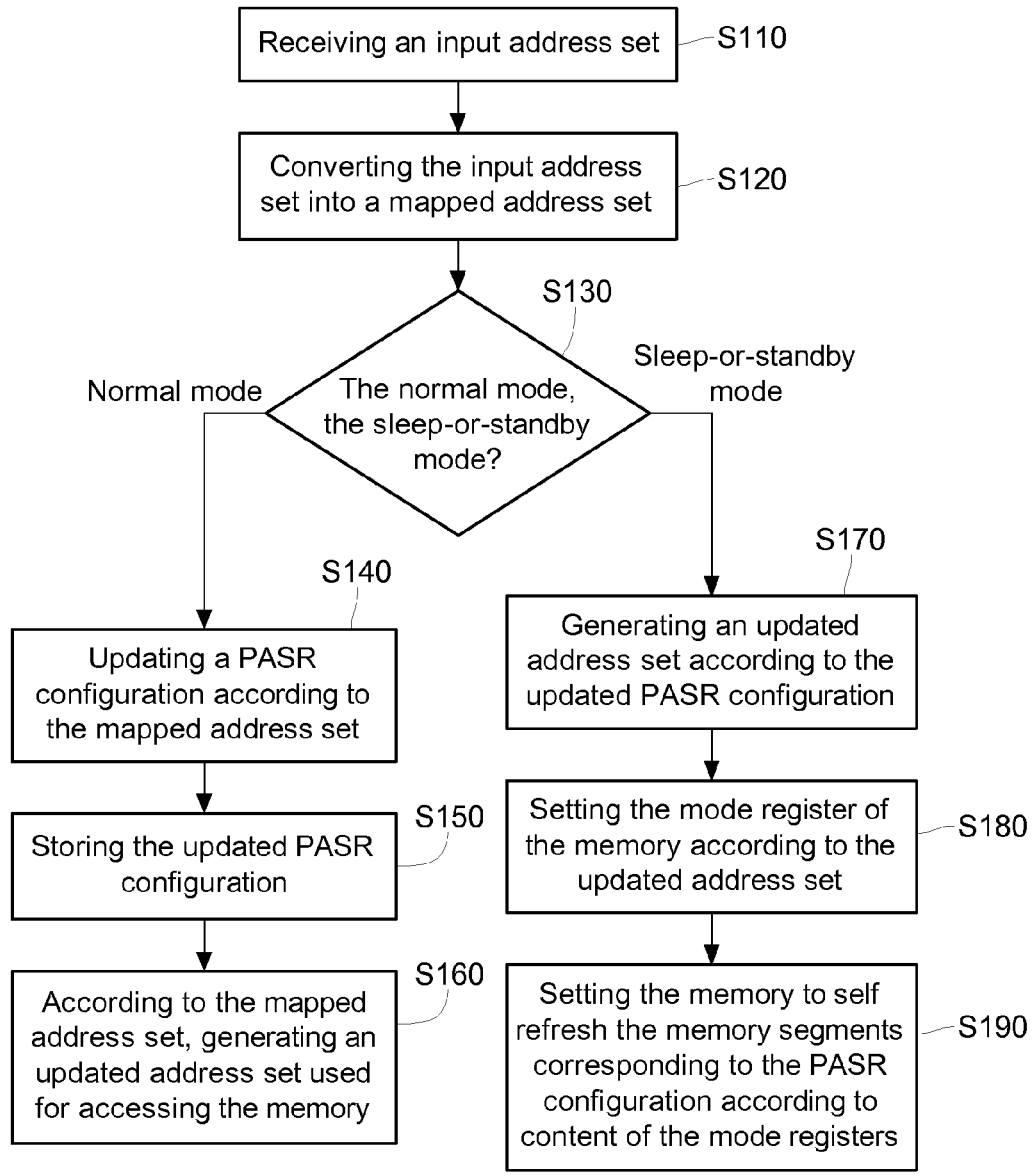
FIG. 13 is a flow chart of a memory controlling method according to an embodiment of the disclosure.

FIG. 13 is a flow chart of the memory controlling method according to an embodiment of the disclosure. A memory controlling method provided by the disclosure is used for generating the mapped address set re_addr, so as to reduce a quantity of the memory banks 41 or the memory segments 42 that are required to be self-refreshed under the sleep-or-standby mode.

The memory controlling device 30 or 60 receives the input address set in_addr (step S110). The address mapper 32 or 62 converts the input address set in_addr into the mapped address set re_addr (step S120). The mapped address set re_addr includes a plurality of the consecutive mapped addresses or at least one mapped address in a limited range. The memory controlling device 30 or 60 determines whether the computer is currently under the normal mode or the sleep-or-standby mode, according to a flag or the current state of the finite state machine (step S130).

Steps S140 to S160 below are performed when the computer is under the normal mode. The address decoder 33 or 63 updates the PASR configuration p_config according to the mapped address set re_addr (step S140), and stores the updated PASR configuration p_config (step S150). The PASR configuration p_config includes a plurality of PASR configuration bits, and the PASR configuration bits correspond to memory segments 42 respectively. Each of the updated PASR configuration bits can be the second default signal 2nd_default, or be the corresponding PASR configuration bit before updating. The address selector 34 or 64 generates the updated address set u_addr used for accessing the memory 40, according to the mapped address set re_addr (step S160).

Steps S170 to S190 are performed as follows when the computer is under the sleep-or-standby mode. The address selector 34 or 64 generates the updated address set u_addr according to the updated PASR configuration p_config (step S170), and sets the mode registers 43 of the memory 40 according to the updated address set u_addr (step S180). Then, the memory controlling device 30 or 60 controls the memory 40 to self refresh the memory segments 42 corresponding to the PASR configuration p_config according to data in the mode registers 43 (step S190).

The disclosure provides various embodiments of step S120 as shown in FIG. 14 to FIG. 20 for generating at least one mapped address in a limited range or for generating the successive mapped addresses.

According to an embodiment, the address mapper 32 converts the input address set in_addr into the mapped address set re_addr according to the address offset addr_offset. For example, the input address set in_addr and the address offset addr_offset are added to generate the mapped address set re_addr.

Figure 14:
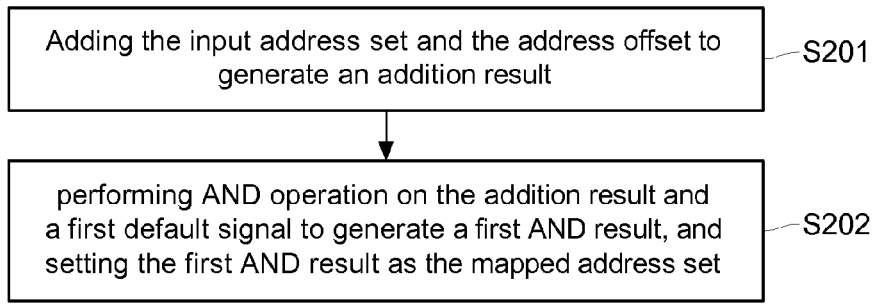
FIG. 14 is a flow chart of step S120 according to an embodiment of the disclosure.

In an example of step S120 as shown in FIG. 3B and FIG. 14, the address mapper 32 adds the input address set in_addr and the address offset addr_offset to generate an addition result, i.e. the output signal op_out, (step S201), performs AND operation on the addition result and the first default signal 1st_default to generate a first AND result which is set as the mapped address set re_addr (step S202). In this way, a quantity of the bits of the mapped addresses of the mapped address set re_addr can be controlled by using the first default signal 1st_default.

Figure 15:
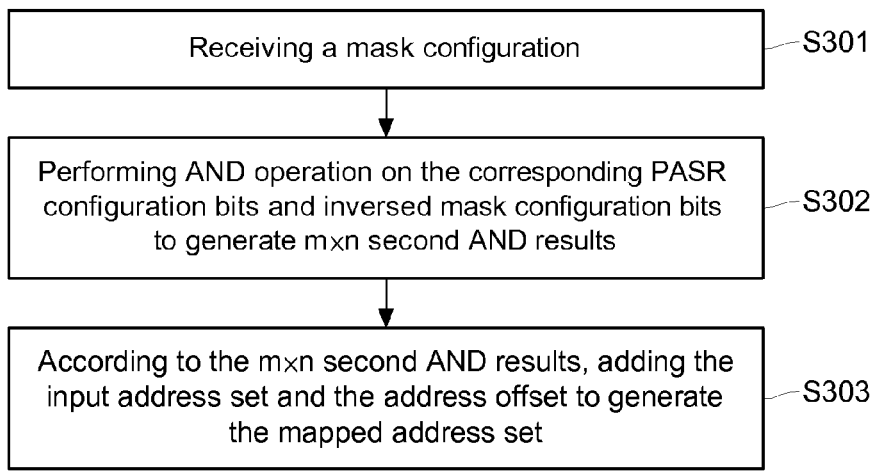
FIG. 15 is a flow chart of step S120 according to an embodiment of the disclosure.

In an example of step S120 as shown in FIG. 3C and FIG. 15, the memory 40 includes the m memory banks 41. Each of the memory banks 41 includes the n memory segments 42, and m and n are positive integers. The quantity of the PASR configuration bits is the product of m and n. The address mapper 32 receives the mask configuration m_config (step S301). The mask configuration m_config includes a plurality of mask configuration bits, and the mask configuration bits correspond to the PASR configuration bits respectively.

The address mapper 32 performs AND operation on the corresponding PASR configuration bits and the inversed mask configuration bits generated by inversing the mask configuration bits, to generate m×n second AND results (step S302), and adds the input address set in_addr and the address offset addr_offset to generate the mapped address set re_addr according to the m×n second AND results (step S303). Furthermore, the address mapper 32 can also perform AND operation on the output signal op_out generated in step S303, and the first default signal 1st_default, and set this AND result as the last mapped address set re_addr.

Figure 16:
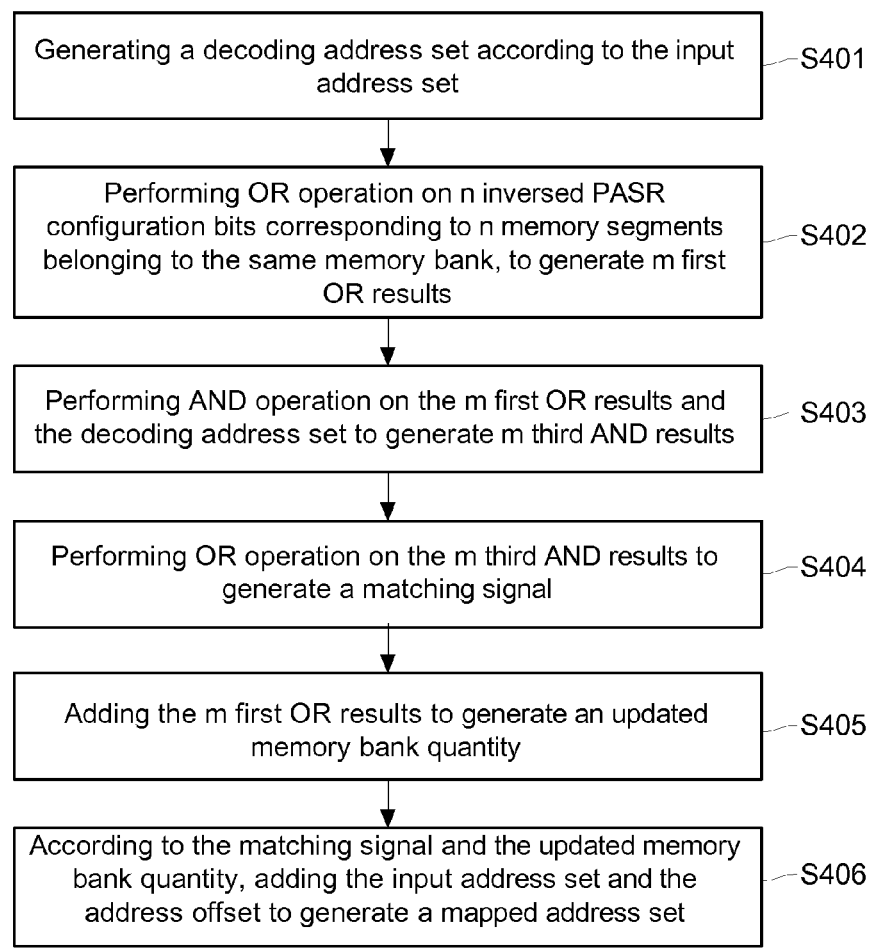
FIG. 16 is a flow chart of step S120 according to an embodiment of the disclosure.

In an example of step S120 as shown in FIG. 3D and FIG. 16, the first decoder 325 of the address mapper 32 generates the decoding address set according to the input address set in_addr (step S401). The first OR gates 326_1 to 326_*m* perform OR operation on the n inversed PASR configuration bits which are generated by inverting the n PASR configuration bits corresponding to the n memory segments 42 belonging to the same memory bank 41, to generate m first OR results (step S402).

Then, the m third AND gates 327_1 to 327_*m* perform AND operation on the m first OR results and the decoding address set respectively to generate m third AND results (step S403). The second OR gate 328 performs OR operation on the m third AND results to generate the matching signal match (step S404). The first adder 329 adds the m first OR results to generate the updated memory bank quantity add_out (step S405). The first operation unit 321 and the first AND gate 322 add the input address set in_addr and the address offset addr_offset to generate the mapped address set re_addr according to the matching signal match and the updated memory bank quantity add_out (step S406).

Furthermore, the first multiplexer 331 of the address decoder 33 updates the PASR configuration p_config according to the mapped address set re_addr and the mask configuration m_config. Each of the updated PASR configuration bits can be the second default signal 2nd_default, or be the corresponding PASR configuration bit before updating.

According to an embodiment, the address mapper 62 converts the input address set in_addr into the mapped address set re_addr according to the input address set in_addr, the default addresses and the look-up addresses.

Figure 17:
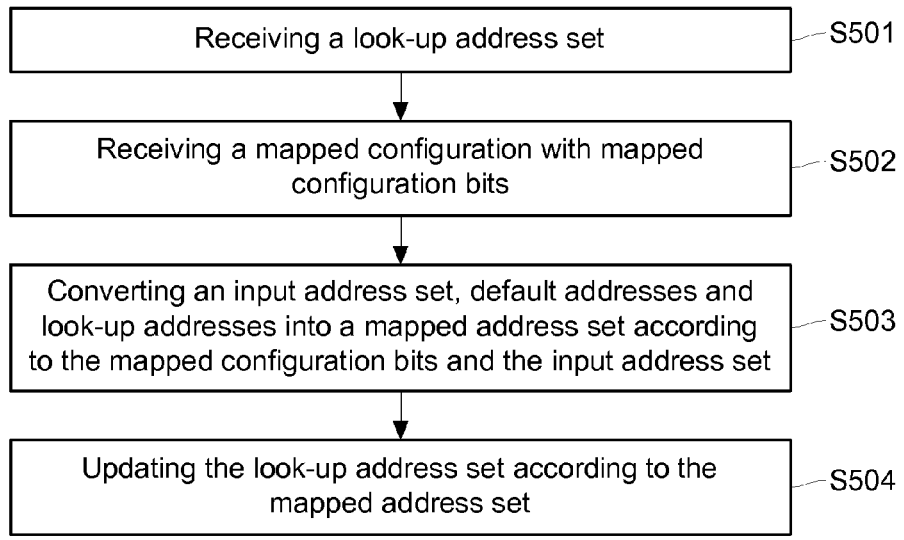
FIG. 17 is a flow chart of step S120 according to an embodiment of the disclosure.

In an example of step S120 as shown in FIG. 9A and FIG. 17, the fourth multiplexer 623 of the address mapper 62 receives the look-up address set having a plurality of look-up addresses (step S501), and receives the mapped configuration s_config having a plurality of mapped configuration bits (step S502). Then, the fourth multiplexer 623 converts the input address set in_addr, the default addresses and the look-up addresses into the mapped address set re_addr according to the mapped configuration bits of the mapped configuration s_config and the input address set in_addr (step S503), and updates the look-up address set according to the mapped address set re_addr (step S504).

Figure 18:
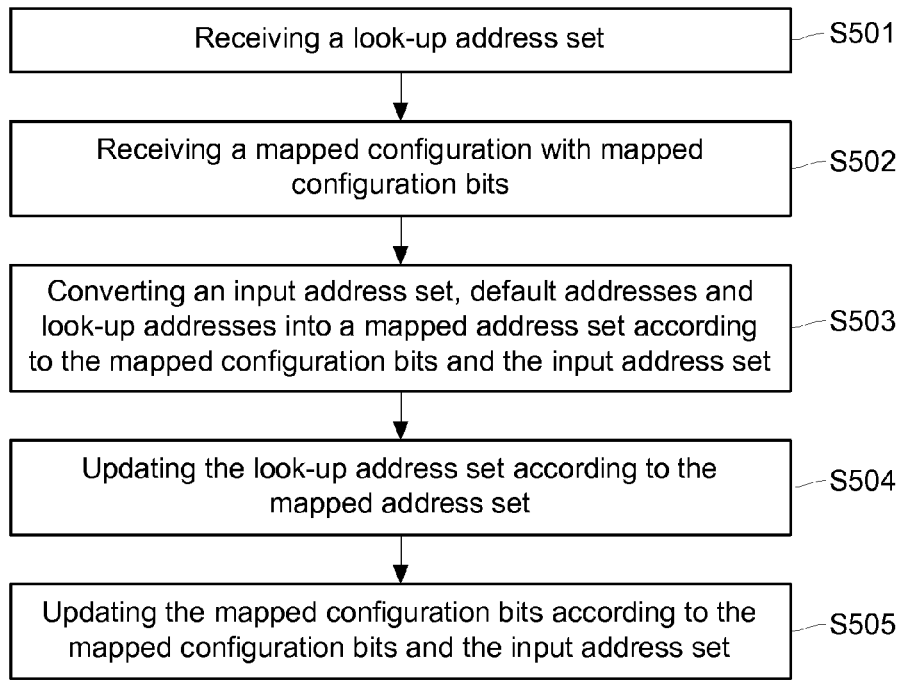
FIG. 18 is a flow chart of step S120 according to an embodiment of the disclosure.

In an example of step S120 as shown in FIG. 9B and FIG. 18, besides steps S501 to S504 mentioned above, the fifth multiplexer 624 of the address mapper 62 updates the mapped configuration bits according to the mapped configuration bits of the mapped configuration s_config and the input address set in_addr (step S505).

Figure 19:
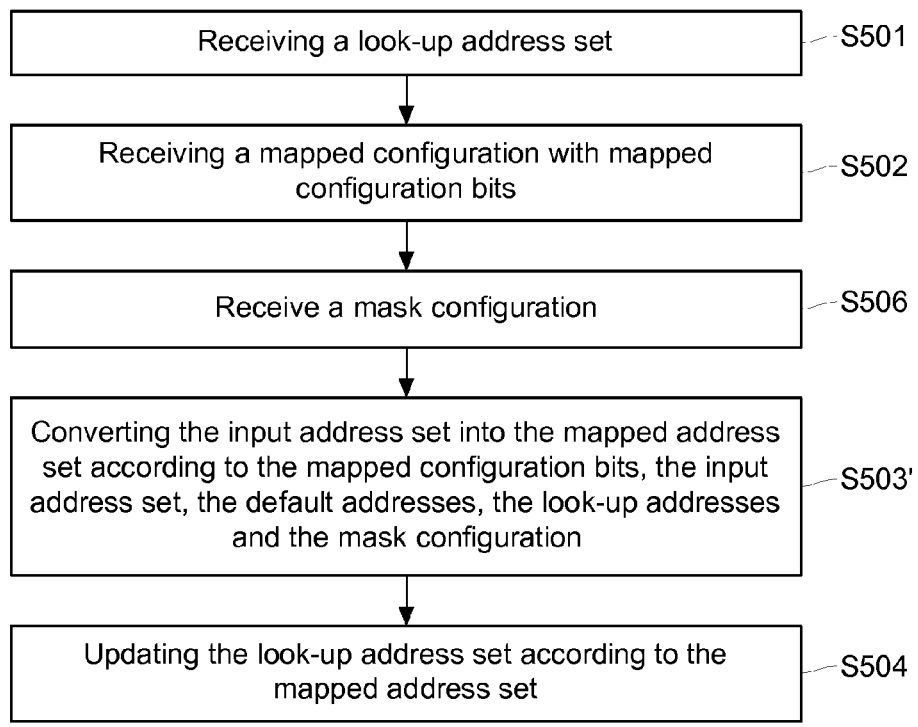
FIG. 19 is a flow chart of step S120 according to an embodiment of the disclosure.

In an example of step S120 as shown in FIG. 9C and FIG. 19, the fourth multiplexer 623 of the address mapper 62 can further receive the mask configuration m_config (step S506). The fourth multiplexer 623 converts the input address set in_addr into the mapped address set re_addr according to the mapped configuration bits of the mapped configuration s_config, the input address set in_addr, the default addresses, the look-up addresses and the mask configuration m_config (step S503'), and updates the look-up address set according to the mapped address set re_addr (step S504).

Figure 20:
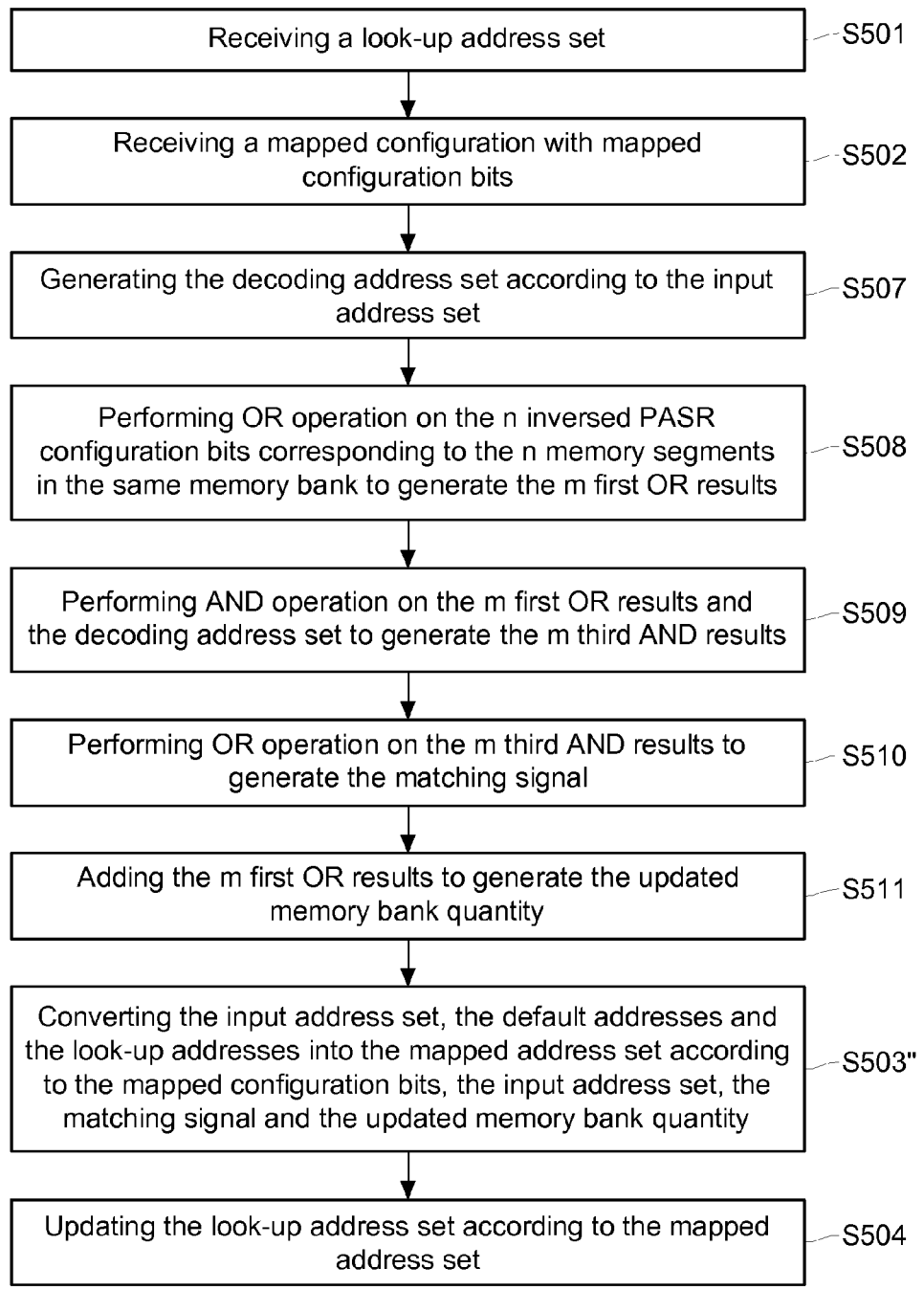
FIG. 20 is a flow chart of step S120 according to an embodiment of the disclosure.

In an example of step S120 as shown in FIG. 9D and FIG. 20, m and n are equal to 8. The first decoder 626 of the address mapper 62 generates the decoding address set according to the input address set in_addr (step S507). The first OR gates 627_1 to 627_8 respectively perform OR operation on n inversed PASR configuration bits, i.e. eight inversed PASR configuration bits, which are generated by inverting the n PASR configuration bits corresponding to the n memory segments 42 belonging to the same memory bank 41, to generate the m first OR results, i.e. eight first OR results, (step S508). The third AND gates 628_1 to 628_8 perform AND operation on the m first OR results and the decoding address set respectively to generate the m third AND results (step S509). Then, the second OR gate 629 performs OR operation on the m third AND results to generate the matching signal match (step S510). The first adder 620 adds the m first OR results to generate the updated memory bank quantity add_out (step S511).

Besides the look-up address set and the mapped configuration s_config, the fourth multiplexer 623 of the address mapper 62 can further receive the matching signal match and the updated memory bank quantity add_out, convert the input address set in_addr, the default addresses and the look-up addresses into the mapped address set re_addr according to the mapped configuration bits, the input address set in_addr, the matching signal match and the updated memory bank quantity add_out (step S503"), and update the look-up address set according to the mapped address set re_addr (step S504).

Furthermore, the first multiplexer 631 of the address decoder 63 updates the PASR configuration p_config according to the input address set in_addr, the matching signal match and the updated memory bank quantity add_out. Each of the updated PASR configuration bits can be the second default signal 2nd_default, or be the corresponding PASR configuration bit before updating.

Figure 21:
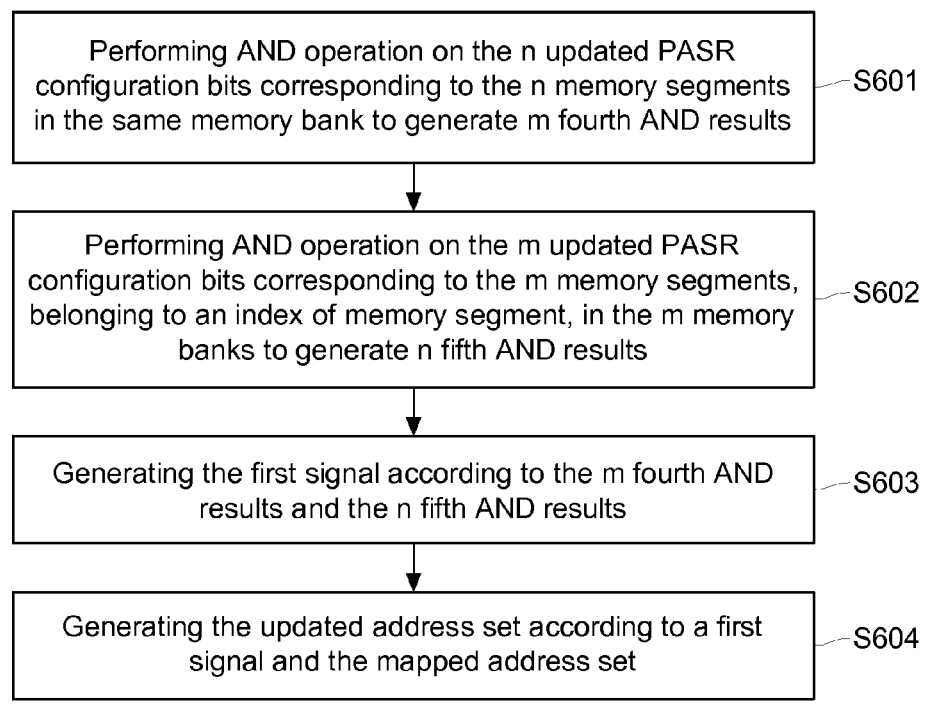
FIG. 21 is a flow chart of step S170 according to an embodiment of the disclosure.

FIG. 21 is a flow chart of step S170 according to an embodiment of the disclosure. The address selector 34 or 64 can generate the updated address set u_addr according to the flow chart in FIG. 21.

Firstly, the m fourth AND gates 341_1 to 341_m or 641_1 to 641_m respectively perform AND operation on the n updated PASR configuration bits corresponding to the n memory segments 42 belonging to the same memory bank 41 to generate m fourth AND results (step S601). Then, the n fifth AND gates 342_1 to 342_n or 642_1 to 642_n perform AND operation on the m updated PASR configuration bits corresponding to the m memory segments 42 belonging to the same index of memory segment in the m memory banks 41 respectively to generate n fifth AND results (step S602). The second multiplexer 343 or 643 generates the first signal according to the m fourth AND results and the n fifth AND results (step S603). The third multiplexer 344 or 644 generates the updated address set u_addr according to the first signal and the mapped address set re_addr (step S604).

Figure 22:
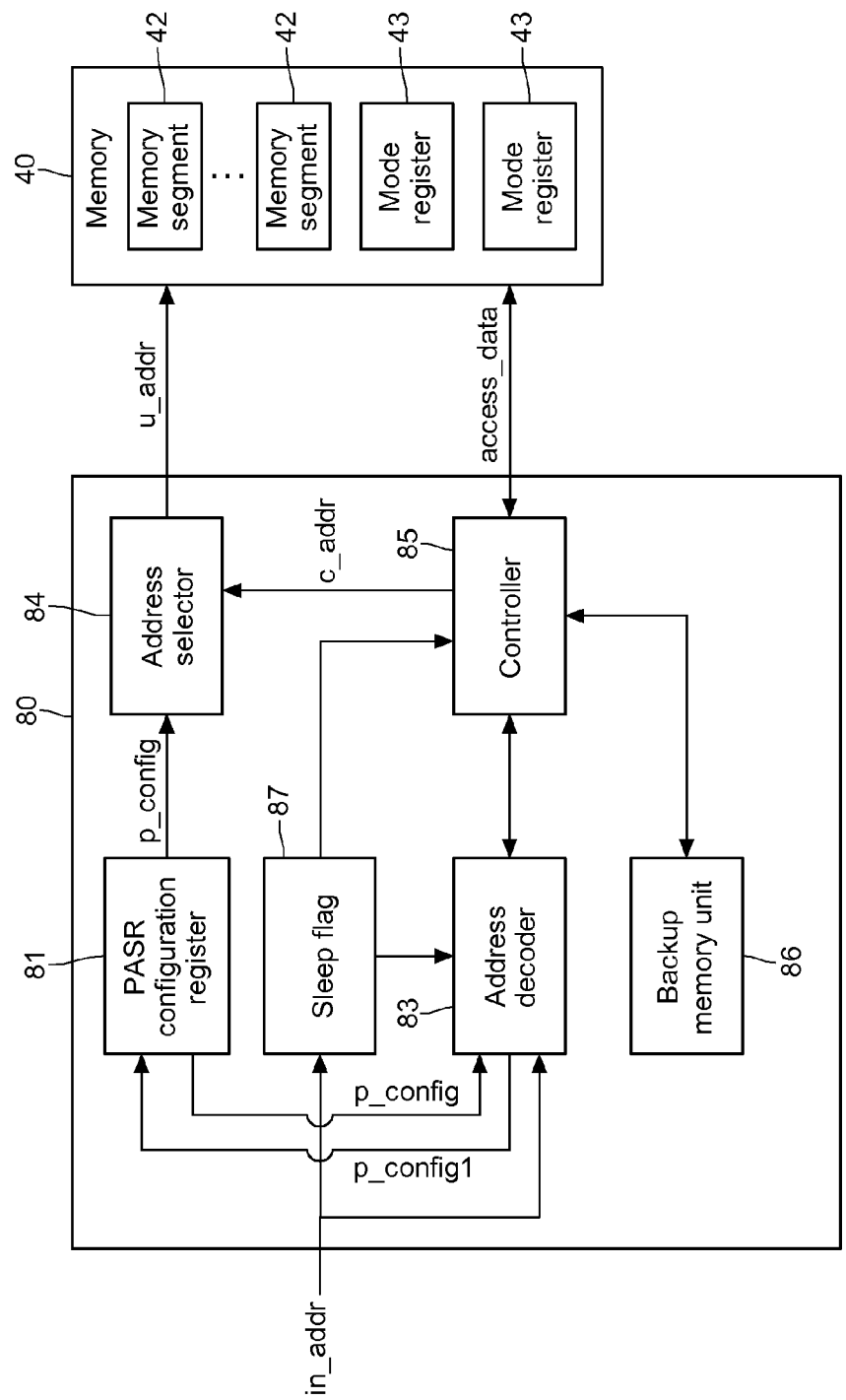
FIG. 22 is a block diagram of the memory controlling device according to an embodiment of the disclosure.

FIG. 22 is a schematic diagram of the memory controlling device according to an embodiment of the disclosure. A memory controlling device 80 includes a PASR configuration register 81, an address decoder 83, an address selector 84, a controller 85, a backup memory unit 86 and a sleep flag 87.

The PASR configuration register 81 is used for storing the PASR configuration p_config. The PASR configuration p_config includes a plurality of PASR configuration bits, and the PASR configuration bits correspond to memory segments 42 of the memory 40 respectively. In this embodiment, an initial value of each of all the PASR configuration bits is, for example, 0, which represents that self refreshing is required for all the memory segments 42 at the startup of the memory 40.

The backup memory unit 86 is, for example, a nonvolatile memory, such as a flash memory or an electrically erasable programmable read only memory (EEPROM). Therefore, even if the computer under the sleep-or-standby mode stops supplying power to the backup memory unit 86, data stored in the backup memory unit 86 will not be removed.

The sleep flag 87 is used for recording whether the computer including the memory 40 and the memory controlling device 80 is under the normal mode or the sleep-or-standby mode. The value of the sleep flag 87 can be set by the processor 50. For example, when the value of the sleep flag 87 is 0, it represents that the computer is not under the sleep-or-standby mode (regarded as the normal mode) now. In contrast, when the value of the sleep flag 87 is 1, it represents that the computer is under the sleep-or-standby mode now.

The controller 85 is coupled to the memory 40, the address selector 84, the address decoder 83 and the backup memory unit 86, and can also be coupled to the sleep flag 87. Under the sleep-or-standby mode, the controller 85 can be used for copying the content of at least one of the memory segments 42 corresponding to a backup address set, to the backup memory unit 86. Under the sleep-or-standby mode, the controller 85 generates a controller output address set c_addr used for accessing the memory 40, and copies the content of at least one of the memory segments 42 corresponding to the controller output address set c_addr, to the backup memory unit 86. Under the normal mode, the controller 85 receives the input address set in_addr to generate the controller output address set c_addr used for accessing the memory 40.

The address decoder 83 is coupled to the sleep flag 87, the controller 85 and the PASR configuration register 81. Under the sleep-or-standby mode, if it is required to copy data to the backup memory unit 86 from the memory 40, the address decoder 83 outputs the PASR configuration update signal p_config1 to update the PASR configuration p_config currently stored in the PASR configuration register 81. Herein, at least one of the PASR configuration bits corresponds to the backup address set.

The address selector 84 is coupled to the memory 40, the PASR configuration register 81 and the controller 85. When the computer is under the normal mode and the memory 40 is under the reading mode or the writing mode, the address selector 84 receives the controller output address set c_addr from the controller 85 to generate the updated address set u_addr used for accessing the memory 40. Under the sleepor-standby mode, the address selector 84 receives the controller output address set c_addr or the updated PASR configuration p_config to generate the updated address set u_addr, so that the memory 40 can self refresh at least one of the memory segments 42 corresponding to the PASR configuration p_config, according to the updated address set u_addr.

More specifically, when it is required under the sleep-or-standby mode to backup data, the address selector 84 receives the controller output address set c_addr to generate the updated address set u_addr, and copies the content of at least one of the memory segments 42 to the backup memory unit 86 according to the updated address set u_addr.

When it is required under the sleep-or-standby mode to set at least one of the mode registers 43 of the memory 40, the address selector 84 receives the updated PASR configuration p_config to generate the updated address set u_addr. Then, the address selector 84 sets at least one of the mode registers 43 according to the updated address set u_addr, so that the memory 40 can self refresh the at least one of the memory segments 42 correspondingly.

According to an embodiment, the controller 85 can monitor the value of the sleep flag 87 regularly to determine whether it is required to backup data. When the value of the sleep flag 87 is changed from 0 to 1, the controller 85 backups data stored in the memory 40, according to the capacity of the backup memory unit 86 and the volume of data stored in the memory 40. For example, when the volume of data stored in the memory 40 currently is less than or equal to the capacity of the backup memory unit 86, all the data can be copied to the backup memory unit 86, and electricity supply for the entire memory 40 and the backup memory unit 86 can be stopped.

When the volume of data stored in the memory 40 currently is greater than the capacity of the backup memory unit 86, the controller 85 can backup the critical system data first, or backup data according to the sequence of the memory segments 42. The controller 85 can set the addresses of the memory segments 42, whose related data has already been copied to the backup memory unit 86, as the backup address set. Because the data stored in the backup memory unit 86 will not be lost, the address decoder 83 can set the PASR configuration bits corresponding to the backup address set, to be 1, which indicates that the memory segments 42 whose data has already been backed up are not required to be self-refreshed, and therefore the electricity supply for the memory segments 42 whose data has already been backed up can be stopped.

When the value of the sleep flag 87 is changed from 1 to 0, it indicates that the sleep-or-standby mode is over. The controller 85 can use the data in the backup memory unit 86 to restore the content originally stored in the memory segments 42, and the address decoder 83 can set the PASR configuration bits corresponding to the restored memory segments 42 to be 0 again.

Figure 23:
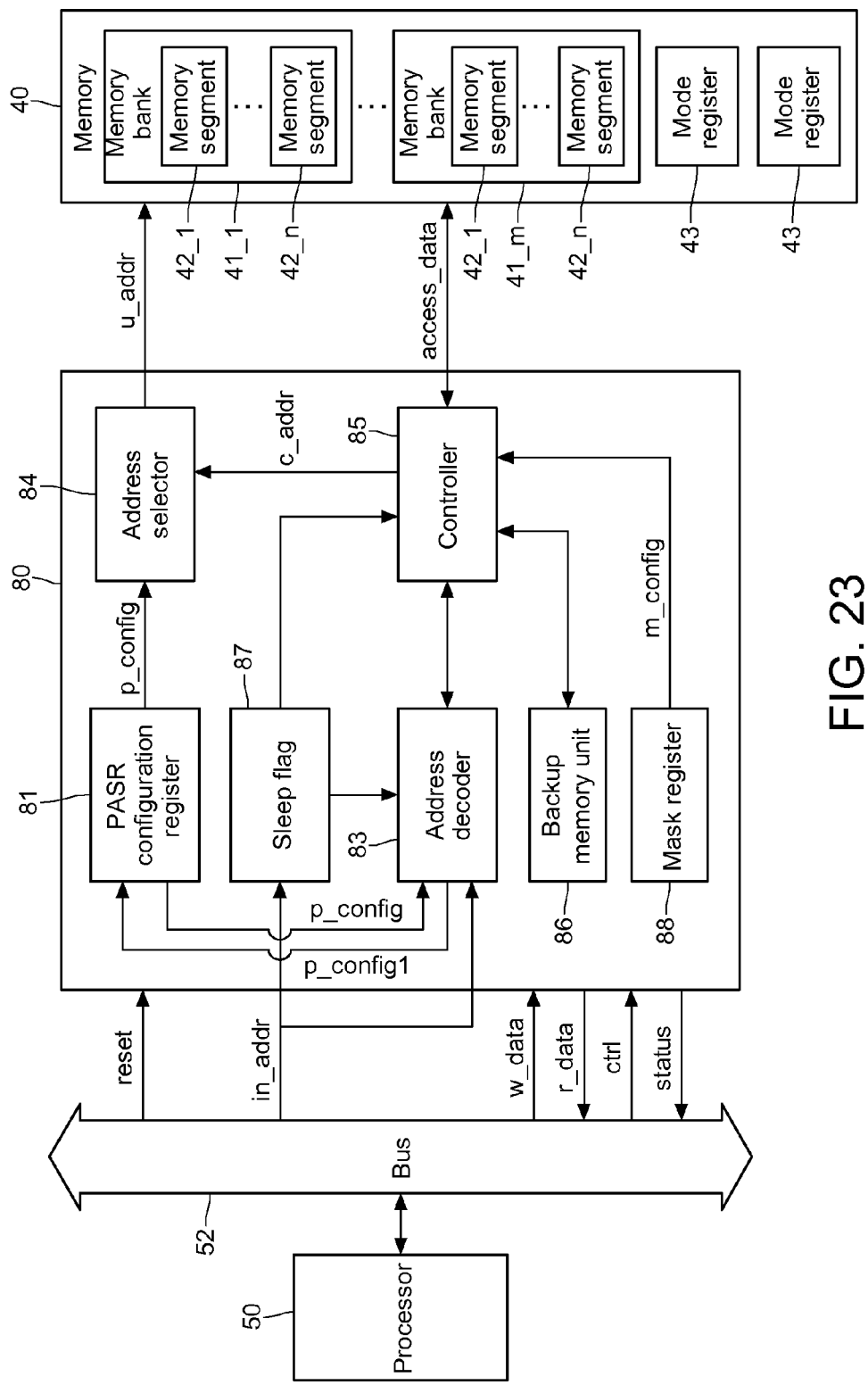
FIG. 23 is a block diagram of the memory controlling device according to an embodiment of the disclosure.

FIG. 23 is a schematic diagram of the memory controlling device according to an embodiment of the disclosure. The memory controlling device 80 can further include a mask register 88. The mask register 88 can be used for storing the mask configuration m_config. The mask configuration m_config includes a plurality of mask configuration bits. The mask configuration bits can correspond to the PASR configuration bits respectively for indicating whether data stored in the memory segments corresponding to the corresponding PASR configuration bits is allowable to be backed up. Furthermore, the mask configuration m_config stored in the mask register 88 can be set externally. If the mask configuration bit is 1, it represents that the corresponding memory segment 42 is not allowable to be backed up. Therefore, when the computer is under the sleep-or-standby mode, the memory segments 42 are needed to be self-refreshed. The controller 85 generates the backup address set according to the mask configuration m_config. In other words, the controller 85 can determine the memory segments 42 which are needed to be backed up, according to the mask configuration m_config.

Figure 24:
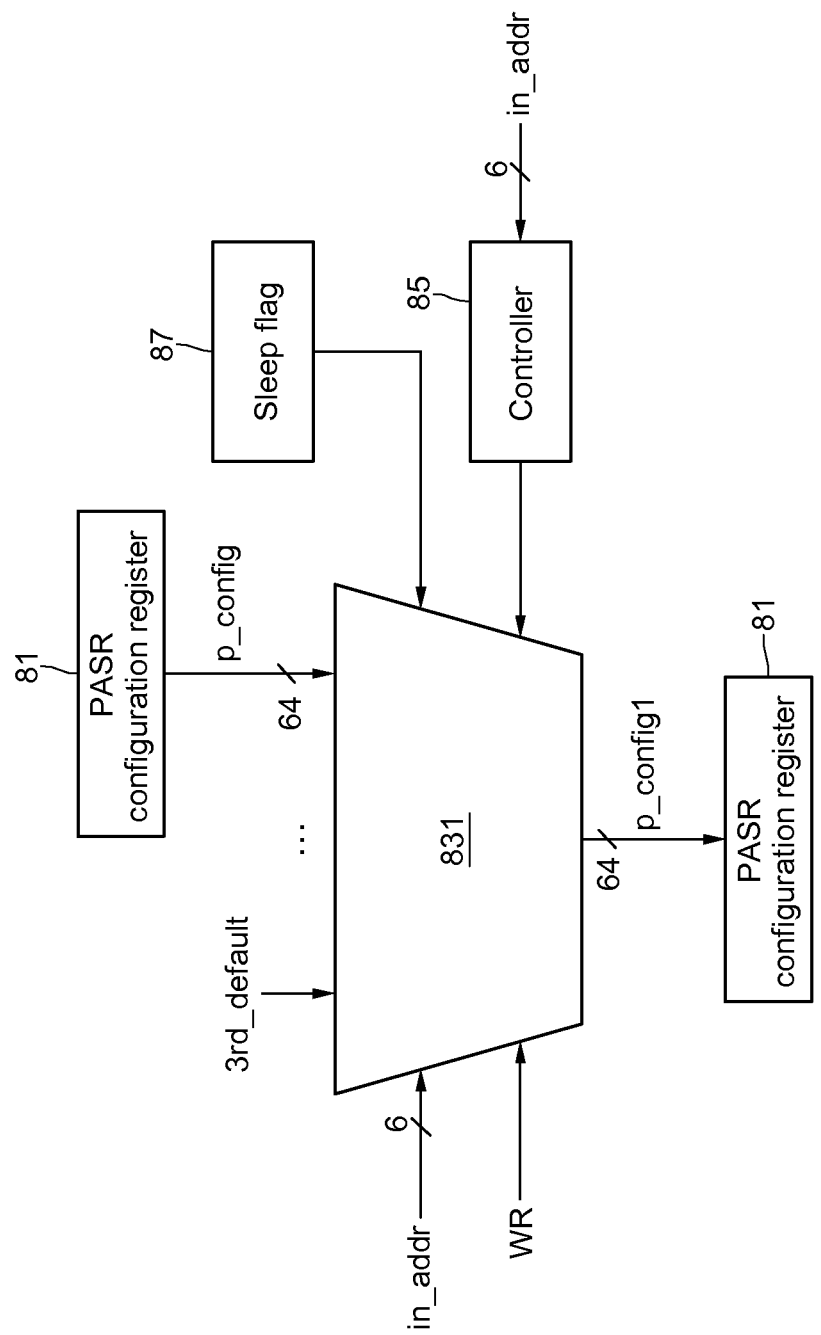
FIG. 24 is a schematic diagram of the address decoder according to an embodiment of the disclosure.

FIG. 24 is a schematic diagram of the address decoder according to an embodiment of the disclosure. The address decoder 83 includes a first multiplexer 831 used for updating the PASR configuration p_config according to the backup address set. Each of the updated PASR configuration bits can be a third default signal 3rd_default, or be the corresponding PASR configuration bit before updating. If the updated PASR configuration bit is the third default signal 3rd_default, it represents that the corresponding memory segment 42 has already been backed up, and is not needed to be self-refreshed. In this embodiment, the third default signal 3rd_default is set to 1.

Figure 25:
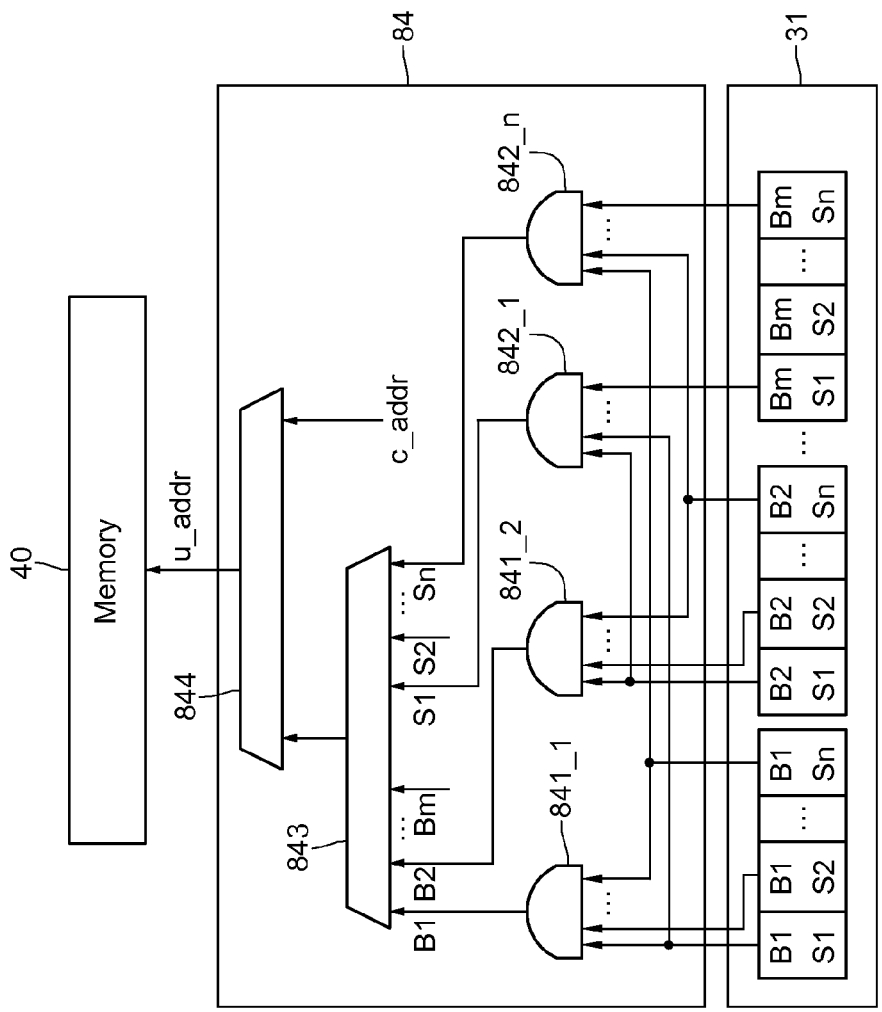
FIG. 25 is a schematic diagram of the address selector according to an embodiment of the disclosure.

FIG. 25 is a schematic diagram of the address selector according to an embodiment of the disclosure. The address selector 84 includes m fourth AND gates 841_1 to 841_m, n fifth AND gates 842_1 to 842_n, a second multiplexer 843 and a third multiplexer 844. The operations of the m fourth AND gates 841_1 to 841_m, the n fifth AND gates 842_1 to 842_n, the second multiplexer 843 and the third multiplexer 844 are similar to those of the m fourth AND gates 341_1 to 341_m, the n fifth AND gates 342_1 to 342_n, the second multiplexer 343 and the third multiplexer 344 in the address selector 34, and therefore will not be described herein again.

When the computer is under the normal mode and the memory 40 is under the reading mode or the writing mode, the address selector 84 receives the controller output address set c_addr from the controller 85 to generate the updated address set u_addr used for accessing the memory 40. Under the sleep-or-standby mode, the address selector 84 receives the updated PASR configuration p_config to generate the updated address set u_addr. The address selector 84 sets at least one of the mode registers 43 of the memory 40 according to the updated address set u_addr, so that the memory 40 can self refresh at least one of the memory segments 42 correspondingly. More specifically, the memory 40 self refreshes the memory segments 42 that have not been backed up.

As set forth above, when the computer is under normal mode and the memory 40 is under the reading mode or the writing mode, the PASR configuration p_config will not be changed. The controller 85 can access the memory 40 according to the control signal ctrl sent by the processor 50. When the computer is under the sleep-or-standby mode, the controller 85 can copy the content of at least one of the memory segments 42 to the backup memory unit 86. The address selector 84 sets at least one of the mode registers 43 of the memory 40 according to the PASR configuration p_config, so that the memory 40 can self refresh at least one of the memory segments 42 correspondingly. The controller 85 can send out commands to the memory 40 to control the memory 40 to enter into the PASR mode to self refresh the memory segments 42 corresponding to the PASR configuration p_config.

According to the embodiments mentioned above, written data is gathered and stored or is backed up, thereby reducing a quantity of the memory segments 42 or the memory banks 41 which are needed to be self-refreshed when the computer is under the sleep-or-standby mode. In this way, the electricity (power consumption) consumed by the memory may be reduced when the computer is under the sleep-or-standby mode, and the standby time of the computer having the memory and the memory controlling device can be prolonged.

What is claimed is:

1. A memory controlling device disposed in a computer for controlling a memory with a partial array self refresh (PASR) function in the computer, the computer operating under a normal mode and a sleep-or-standby mode, the memory comprising a plurality of memory segments, the memory controlling device comprising:
   a PASR configuration register, for storing a PASR configuration, the PASR configuration comprising a plurality of PASR configuration bits, and the PASR configuration bits corresponding to the memory segments respectively;
   an address mapper, for receiving an input address set, converting the input address set into a mapped address set, and outputting the mapped address set, wherein the mapped address set comprises at least one mapped address in a limited range or comprises a plurality of successive mapped addresses;
   an address decoder, coupled to the PASR configuration register and the address mapper, for receiving the mapped address set and the PASR configuration under the normal mode, updating the PASR configuration according to the mapped address set, and storing the updated PASR configuration in the PASR configuration register; and
   an address selector, coupled to the memory, the address mapper and the PASR configuration register, for under the normal mode, receiving the mapped address set to generate an updated address set for the accessing of the memory, for under the sleep-or-standby mode, receiving the updated PASR configuration to generate the updated address set, and for setting at least one mode register of the memory according to the updated address set, and for controlling the memory to self refresh at least one of the memory segments, which correspond to the PASR configuration, according to content of the at least one mode register;
   wherein the address mapper receives the input address set and an address offset, and converts the input address set into the mapped address set according to the address offset, and the memory comprises m memory banks, each of the memory banks comprises n pieces of the memory segments, m and n are positive integers, and the address mapper further comprises:
      a mask register, for storing a mask configuration comprising a plurality of mask configuration bits corresponding to the PASR configuration bits respectively; and
      m×n second AND gates, for performing AND operation on the corresponding PASR configuration bits and inversed mask configuration bits generated by inversing the mask configuration bits; and
      a first operation unit, for adding the input address set and the address offset to generate the mapped address set according to the AND results of the m×n second AND gates.

2. The memory controlling device according to claim 1, further comprising:
   a controller, coupled to the memory, the address mapper and the address selector, for receiving the mapped address set from the address mapper, transmitting the mapped address set to the address selector, and controlling and accessing the memory.

3. The memory controlling device according to claim 1, wherein
   the first operation unit outputs the mapped address set to the controller.

4. The memory controlling device according to claim 1, wherein the address mapper comprises:
   a first AND gate, for performing AND operation on an output signal of the first operation unit and a first default signal, for setting the AND result as the mapped address set, and for outputting the mapped address set to the controller.

5. The memory controlling device according to claim 1, wherein the address decoder comprises:
   a first multiplexer, for updating the PASR configuration according to the mapped address set and the AND results of the m×n second AND gates, wherein each of the updated PASR configuration bits is a second default signal, or is the corresponding PASR configuration bit before updating.

6. The memory controlling device according to claim 4, wherein the address mapper further comprises:
   a first decoder, for generating a decoding address set according to the input address set;
   m first OR gates, for performing OR operation on n inversed PASR configuration bits which are generated by inversing n pieces of the PASR configuration bits and correspond to n pieces of the memory segments in the same memory bank;
   m third AND gates, for respectively performing AND operation on the decoding address set and the OR results of the m first OR gates;
   a second OR gate, for performing OR operation on the AND results of the m third AND gates to generate a matching signal; and
   a first adder, for adding the OR results of the m first OR gates to generate an updated memory bank quantity;
   wherein the first operation unit adds the input address set and the address offset to generate the mapped address set according to the matching signal and the updated memory bank quantity.

7. The memory controlling device according to claim 6, wherein the address decoder comprises:
   a first multiplexer, for updating the PASR configuration according to the mapped address set, the matching signal and the updated memory bank quantity, wherein each of the updated PASR configuration bits is a second default signal, or is the corresponding PASR configuration bit before updating.

8. The memory controlling device according to claim 1, wherein under the normal mode, the address mapper receives the input address set, a plurality of default addresses and a plurality of look-up addresses, and converts the input address set into the mapped address set according to the input address set, the default addresses and the look-up addresses.

9. The memory controlling device according to claim 8, further comprising:
   a controller, coupled to the memory, the address mapper and the address selector, for receiving the mapped address set from the address mapper, transmitting the mapped address set to the address selector, and controlling and accessing the memory.

10. The memory controlling device according to claim 9, wherein the address mapper comprises:
   a look-up register, for storing a look-up address set comprising the look-up addresses;
   a mapped register, for storing a mapped configuration with a plurality of mapped configuration bits, wherein the mapped configuration bits correspond to indexes of the look-up addresses one by one, for indicating whether the look-up addresses have been used for mapping; and a fourth multiplexer, for converting the input address set, the default addresses and the look-up addresses into the mapped address set according to the mapped configuration bits and the input address set, for outputting the mapped address set to the controller, for updating the look-up address set according to the mapped address set, and for storing the updated look-up address set in the look-up register.

11. The memory controlling device according to claim 10, wherein the address mapper further comprises:

a fifth multiplexer, for updating the mapped configuration bits according to the mapped configuration bits and the input address set, and for storing the updated mapped configuration bits in the mapped register.

12. The memory controlling device according to claim 10, wherein the fourth multiplexer converts the input address set into the mapped address set according to the mapped configuration bits, the input address set, the default addresses, the look-up addresses and the mask configuration.

13. The memory controlling device according to claim 10, wherein the address mapper further comprises:

a first decoder, for generating a decoding address set according to the input address set;

m first OR gates, for performing OR operation on n inversed PASR configuration bits which are generated by inversing n pieces of the PASR configuration bits corresponding to the n memory segments in the same memory bank;

m third AND gates, for performing AND operation on the decoding address set and the OR results of the m first OR gates respectively;

a second OR gate, for performing an OR operation on the AND results of the m third AND gates to generate a matching signal; and a first adder, for adding the OR results of the m first OR gates to generate an updated memory bank quantity;

wherein the fourth multiplexer converts the input address set, the default addresses and the look-up addresses into the mapped address set according to the mapped configuration bits, the input address set, the matching signal and the updated memory bank quantity.

14. The memory controlling device according to claim 13, wherein the address decoder comprises:

a first multiplexer, for updating the PASR configuration according to the input address set, the matching signal and the updated memory bank quantity, wherein each of the updated PASR configuration bits is a second default signal, or is the corresponding PASR configuration bit before updating.

15. The memory controlling device according to claim 1, wherein the address decoder comprises:

a first multiplexer, for updating the PASR configuration according to the mapped address set, wherein each of the updated PASR configuration bits is a second default signal, or is the corresponding PASR configuration bit before updating.

16. The memory controlling device according to claim 1, wherein the address selector comprises:

m fourth AND gates, for performing AND operation on n pieces of the updated PASR configuration bits corresponding to the n memory segments in the same memory bank;

n fifth AND gates, for performing AND operation on m pieces of the updated PASR configuration bits corresponding to the m memory segments belonging to an index of memory segment in the m memory banks;

a second multiplexer, for outputting a first signal according to the AND results of the m fourth AND gates and the n fifth AND gates; and a third multiplexer used for generating the updated address set according to the first signal and the mapped address set.

17. A memory controlling method used for controlling a memory with a partial array self refresh (PASR) function in a computer, the computer operating under a normal mode and a sleep-or-standby mode, the memory comprising a plurality of memory segments, the memory controlling method comprising:

receiving an input address set;

converting the input address set into a mapped address set, wherein the mapped address set comprises at least one mapped address in a limited range or comprises a plurality of successive mapped addresses;

performing following steps under the normal mode:
updating a PASR configuration according to the mapped address set, wherein the PASR configuration comprises a plurality of PASR configuration bits, and the PASR configuration bits correspond to memory segments respectively;
storing the updated PASR configuration; and
generating an updated address set, used for accessing the memory, according to the mapped address set; and performing following steps under the sleep-or-standby mode:
generating the updated address set according to the updated PASR configuration;
setting at least one mode register of the memory according to the updated address set; and
controlling the memory to self refresh at least one of the memory segments, corresponding to the PASR configuration, according to content of the at least one mode register;

wherein in the step of converting the input address set into the mapped address set, the input address set is converted into the mapped address set according to an address offset, and the memory comprises m memory banks, each of the m memory banks comprises n pieces of the memory segments, m and n are positive integers, a quantity of the PASR configuration bits is m×n, and the step of converting the input address set into the mapped address set comprises:

receiving a mask configuration comprising a plurality of mask configuration bits which correspond to the PASR configuration bits respectively;

performing AND operation on the corresponding PASR configuration bits and inversed mask configuration bits, which are generated by inversing the mask configuration bits, to generate m×n second AND results; and adding the input address set and the address offset to generate the mapped address set according to the m×n second AND results.

18. The memory controlling method according to claim 17, wherein the step of converting the input address set into the mapped address set comprises:

adding the input address set and the address offset to generate an addition result; and performing AND operation on the addition result and a first default signal to generate a first AND result, and setting the first AND result as the mapped address set.

19. The memory controlling method according to claim 17, wherein in the step of updating the PASR configuration according to the mapped address set, the PASR configuration is updated according to the mapped address set and the mask configuration, wherein each of the updated PASR configuration bits is a second default signal, or is the corresponding PASR configuration bit before updating.

20. The memory controlling method according to claim 17, wherein the step of converting the input address set into the mapped address set comprises:
    generating a decoding address set according to the input address set;
    performing OR operation on n inversed PASR configuration bits, which are generated by inversing n pieces of the PASR configuration bits and correspond to the n memory segments in the same memory bank, to generate m first OR results;
    performing AND operation on the m first OR results and the decoding address set to generate m third AND results;
    performing OR operation on the m third AND results to generate a matching signal;
    adding the m first OR results to generate an updated memory bank quantity; and
    adding the input address set and the address offset to generate the mapped address set according to the matching signal and the updated memory bank quantity.

21. The memory controlling method according to claim 20, wherein in the step of updating the PASR configuration according to the mapped address set, the PASR configuration is updated according to the mapped address set, the matching signal and the updated memory bank quantity, each of the updated PASR configuration bits is a second default signal, or is the corresponding PASR configuration bit before updating.

22. The memory controlling method according to claim 17, wherein in the step of converting the input address set into the mapped address set, the input address set is converted into the mapped address set according to the input address set, a plurality of default addresses and a plurality of look-up addresses.

23. The memory controlling method according to claim 22, wherein the step of converting the input address set into the mapped address set comprises:
    receiving a look-up address set comprising the look-up addresses;
    receiving a mapped configuration with a plurality of mapped configuration bits, the mapped configuration bits corresponding to indexes of the look-up addresses respectively, for indicating whether the look-up addresses have been used for mapping;
    converting the input address set, the default addresses and the look-up addresses into the mapped address set according to the mapped configuration bits and the input address set; and
    updating the look-up address set according to the mapped address set.

24. The memory controlling method according to claim 23, wherein the step of converting the input address set into the mapped address set further comprises:
    updating the mapped configuration bits according to the mapped configuration bits and the input address set.

25. The memory controlling method according to claim 23, wherein in the step of converting the input address set, the default addresses and the look-up addresses into the mapped address set according to the mapped configuration bits and the input address set, the input address set is converted into the mapped address set according to the mapped configuration bits, the input address set, the default addresses, the look-up addresses and the mask configuration.

26. The memory controlling method according to claim 23, wherein the step of converting the input address set into the mapped address set further comprises:
    generating a decoding address set according to the input address set;
    performing OR operation on n inversed PASR configuration bits, which are generated by inversing n pieces of the PASR configuration bits corresponding to the n memory segments in the same memory bank, to generate m first OR results;
    performing AND operation on the m first OR results and the decoding address set to generate m third AND results;
    performing an OR operation on the m third AND results to generate a matching signal;
    adding the m first OR results to generate an updated memory bank quantity; and
    wherein in the step of converting the input address set, the default addresses and the look-up addresses into the mapped address set according to the mapped configuration bits and the input address set, the input address set, the default addresses and the look-up addresses are converted into the mapped address set according to the mapped configuration bits, the input address set, the matching signal and the updated memory bank quantity.

27. The memory controlling method according to claim 26, wherein in the step of updating the PASR configuration according to the mapped address set, the PASR configuration is updated according to the input address set, the matching signal and the updated memory bank quantity, each of the updated PASR configuration bits is a second default signal, or is the corresponding PASR configuration bit before updating.

28. The memory controlling method according to claim 17, wherein each of the updated PASR configuration bits is a second default signal, or is the corresponding PASR configuration bit before updating.

29. The memory controlling method according to claim 17, wherein the step of generating the updated address set according to the updated PASR configuration comprises:
    performing AND operation on n pieces of the updated PASR configuration bits corresponding to the n memory segments in the same memory bank to generate m fourth AND results;
    performing AND operation on m pieces of the updated PASR configuration bits, which correspond to the m memory segments belonging to an index of memory segment in the m memory banks, to generate n fifth AND results;
    generating a first signal according to the m fourth AND results and the n fifth AND results; and
    generating the updated address set according to the first signal and the mapped address set.

30. A memory controlling device disposed in a computer and used for controlling a memory with a partial array self refresh (PASR) function in the computer, the memory comprising a plurality of memory segments, the memory controlling device comprising:
    a backup memory unit;

a sleep flag, for recording whether the computer comprising the memory is under a normal mode or a sleep-or-standby mode;

a PASR configuration register, for storing a PASR configuration, the PASR configuration comprising a plurality of PASR configuration bits, and the PASR configuration bits corresponding to the memory segments respectively;

a controller, coupled to the memory, the sleep flag and the backup memory unit, for under the sleep-or-standby mode, generating a controller output address set used for accessing the memory, and copying content of at least one of the memory segments, which corresponds to the controller output address set, to the backup memory unit;

an address decoder, coupled to the sleep flag, the controller and the PASR configuration register, for updating at least one of the PASR configuration bits of the PASR configuration, which corresponds to the controller output address set, under the sleep-or-standby mode, and for storing the updated PASR configuration in the PASR configuration register; and an address selector, coupled to the memory, the PASR configuration register and the controller, for receiving the controller output address set or the updated PASR configuration under the sleep-or-standby mode to generate an updated address set, so as to control the memory to self refresh the at least one memory segment, corresponding to the PASR configuration, according to the updated address set;

wherein the memory comprises m memory banks, each of the m memory banks comprises n pieces of the memory segments, m and n are positive integers, the address selector comprises:

m fourth AND gates, for performing AND operation on n pieces of the updated PASR configuration bits corresponding to the n memory segments in the same memory bank;

n fifth AND gates, for performing AND operation on m pieces of the updated PASR configuration bits corresponding to the m memory segments belonging to an index of memory segment in the m memory banks;

a second multiplexer, for outputting a first signal according to the AND results of the m fourth AND gates and the n fifth AND gates; and a third multiplexer, for generating the updated address set according to the first signal and the controller output address set.

31. The memory controlling device according to claim 30, wherein the controller receives an input address set under the normal mode to generate the controller output address set used for accessing the memory according to the input address set.

32. The memory controlling device according to claim 30, wherein the address selector receives the controller output address set under the normal mode to generate the updated address set used for accessing the memory.

33. The memory controlling device according to claim 32, wherein the address selector receives the controller output address set under the sleep-or-standby mode to generate the updated address set, and copies content of at least one of the memory segments to the backup memory unit according to the updated address set.

34. The memory controlling device according to claim 33, wherein the address selector receives the updated PASR configuration under the sleep-or-standby mode to generate the updated address set, and sets at least one mode register according to the updated address set.

35. The memory controlling device according to claim 30, wherein the backup memory unit is a nonvolatile memory.

36. The memory controlling device according to claim 30, wherein the PASR configuration are preset to enable that all the memory segments are needed to be self-refreshed.

37. The memory controlling device according to claim 30, wherein the memory controlling device further comprises:

a mask register, for storing a mask configuration;

wherein the controller generates a backup address set according to the mask configuration.

38. The memory controlling device according to claim 30, wherein the address decoder comprises:

a first multiplexer, for updating the PASR configuration according to the backup address set and the sleep flag, wherein each of the updated PASR configuration bits is a third default signal, or is the corresponding PASR configuration bit before updating.

* * * * *